(12) United States Patent
Li et al.

(10) Patent No.: US 11,450,395 B2
(45) Date of Patent: Sep. 20, 2022

(54) NON-VOLATILE MEMORY CIRCUIT AND METHOD

(71) Applicant: TAIWAN SEMICONDUCTOR MANUFACTURING COMPANY, LTD., Hsinchu (TW)

(72) Inventors: Gu-Huan Li, Hsinchu (TW); Chen-Ming Hung, Hsinchu (TW); Yu-Der Chih, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/237,688

(22) Filed: Apr. 22, 2021

(65) Prior Publication Data

US 2022/0262445 A1 Aug. 18, 2022

Related U.S. Application Data

(60) Provisional application No. 63/148,800, filed on Feb. 12, 2021.

(51) Int. Cl.
| | |
|---|---|
| *G11C 17/00* | (2006.01) |
| *G11C 17/18* | (2006.01) |
| *G11C 17/16* | (2006.01) |
| *G11C 8/10* | (2006.01) |
| *G11C 7/10* | (2006.01) |

(52) U.S. Cl.
CPC ............ *G11C 17/18* (2013.01); *G11C 7/1069* (2013.01); *G11C 7/1096* (2013.01); *G11C 8/10* (2013.01); *G11C 17/16* (2013.01)

(58) Field of Classification Search
CPC ..... G11C 17/18; G11C 7/1069; G11C 7/1096; G11C 8/10; G11C 17/16

USPC .......................................................... 365/96
See application file for complete search history.

(56) References Cited

U.S. PATENT DOCUMENTS

| | | | | |
|---|---|---|---|---|
| 6,462,998 | B1 * | 10/2002 | Proebsting | G11C 7/04 365/194 |
| 8,050,133 | B2 * | 11/2011 | Yun | G11C 8/18 365/230.06 |

FOREIGN PATENT DOCUMENTS

| | | |
|---|---|---|
| TW | 202015219 | 4/2020 |
| TW | 202044047 | 12/2020 |

OTHER PUBLICATIONS

Office Action dated Dec. 28, 2021 for corresponding case No. TW 11021269110. (pp. 1-4).

\* cited by examiner

*Primary Examiner* — Huan Hoang
(74) *Attorney, Agent, or Firm* — Hauptman Ham LLP

(57) ABSTRACT

A memory circuit includes a first bank of non-volatile memory (NVM) devices, a first plurality of decoders, a first plurality of high-voltage (HV) drivers corresponding to the first plurality of decoders, and a first plurality of HV power switches. A first HV power switch is coupled to each HV driver of the first plurality of HV drivers, and each decoder is configured to generate an enable signal corresponding to a column of the first bank of NVM devices. Each HV driver is configured to output a HV activation signal to the corresponding column of the first bank of NVM devices responsive to a power signal of the first HV power switch and to the enable signal of the corresponding decoder.

20 Claims, 12 Drawing Sheets

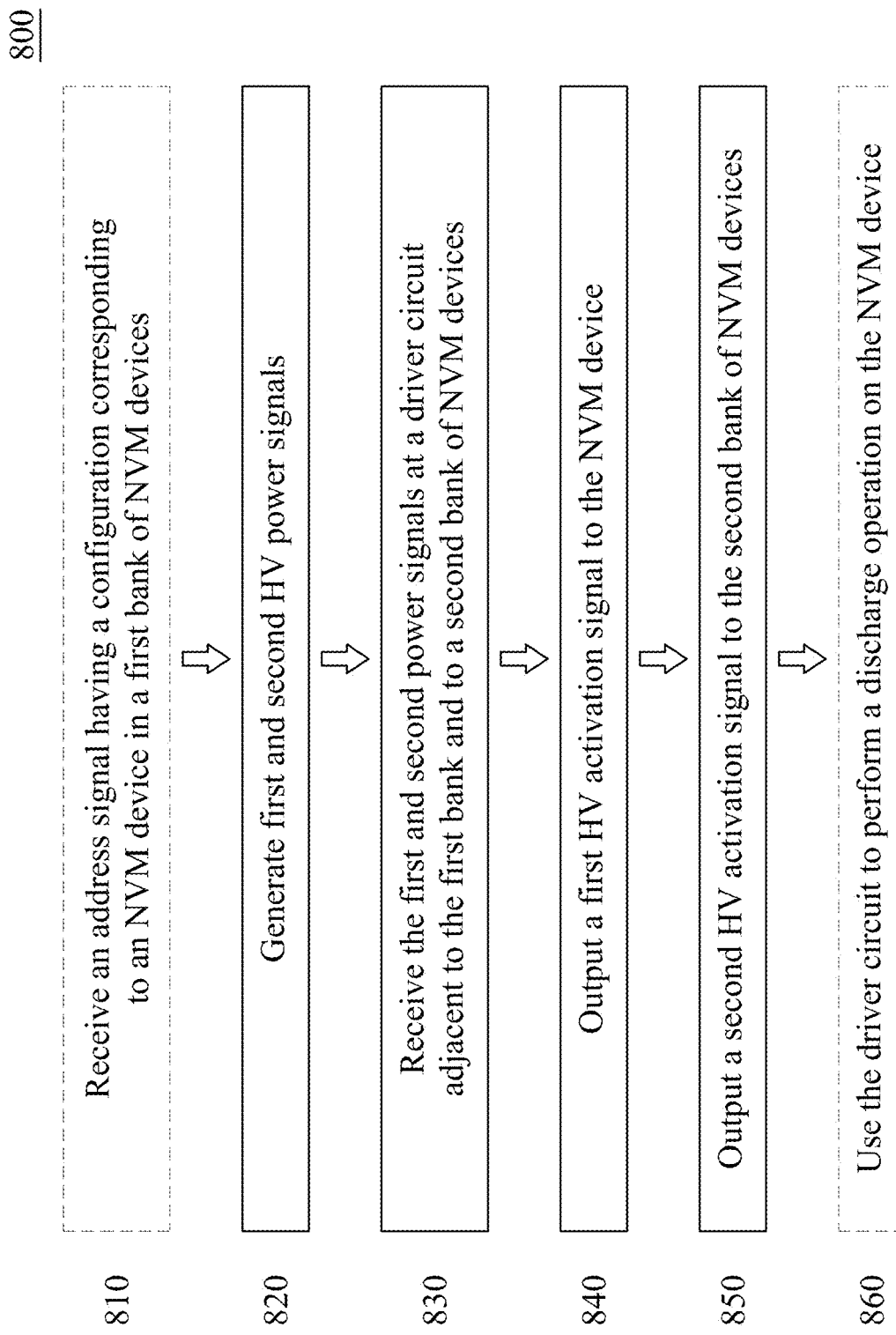

NON-VOLATILE MEMORY CIRCUIT AND METHOD

PRIORITY CLAIM

The present application claims the priority of U.S. Provisional Application No. 63/148,800, filed Feb. 12, 2021, which is incorporated herein by reference in its entirety.

BACKGROUND

Integrated circuits (ICs) sometimes include non-volatile memory (NVM) in which data are not lost when the IC is powered off. In some NVM applications, one-time-programmable (OTP) memory elements are designed to have an initial logical state that is capable of being irreversibly switched in a programming operation. One type of OTP memory includes an anti-fuse bit integrated into an IC by using a layer of dielectric material (oxide, etc.) connected to other circuit elements. To program an anti-fuse bit, a programming electric field is applied across the dielectric material layer to sustainably alter (e.g., break down) the dielectric material, thus decreasing the resistance of the dielectric material layer. Typically, to determine the status of an anti-fuse bit, a read voltage lower than the program voltage is applied across the dielectric material layer and a resultant current is read.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a flowchart of a method of performing a programming operation, in accordance with some embodiments.

DETAILED DESCRIPTION

Figure 1A:
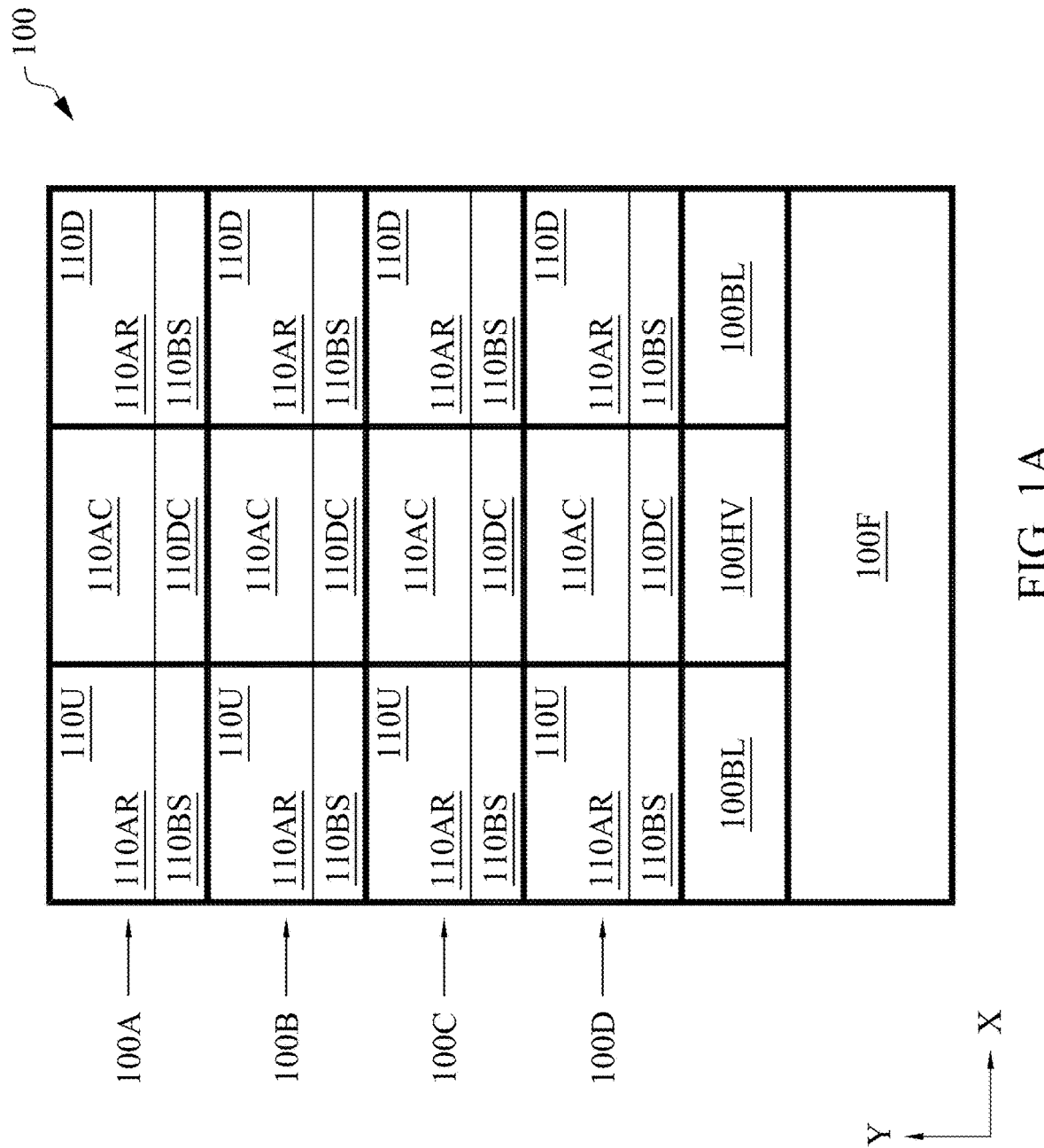
FIGS. 1A and 1B are diagrams of a memory circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a memory circuit includes a dual path, hierarchical arrangement used to distribute high voltage (HV) levels during program and read operations such that non-selected NVM devices in banks adjacent to device driver circuits receive a corresponding HV activation signal having either a low voltage (LV) or ground voltage level. Compared to approaches in which NVM devices in adjacent, non-selected banks receive program and read voltage levels during program and read operations on adjacent selected banks, NVM device current leakage levels are reduced, thereby reducing power consumption, and HV stresses are reduced, thereby improving NVM device reliability.

In some embodiments, the dual path, hierarchical arrangement includes HV power switches and HV drivers configured to generate HV activation signals by switching a ground signal from a ground voltage level to a middle voltage (MV) level, either by detecting a HV level or based on a delay circuit. Compared to approaches that do not include switching a ground signal from a ground voltage level to a MV level, HV drivers are capable of including fewer cascode transistors, thereby reducing area requirements.

In some embodiments, a dual path, hierarchical arrangement in which HV power switches are configured to detect HV levels includes a feedback arrangement whereby discharge times are controlled during NVM device program operations. Compared to approaches that do not include detecting HV levels to control discharge times, such embodiments are capable of reducing power requirements and avoiding residual voltage damage in subsequent operations.

Figure 1B:
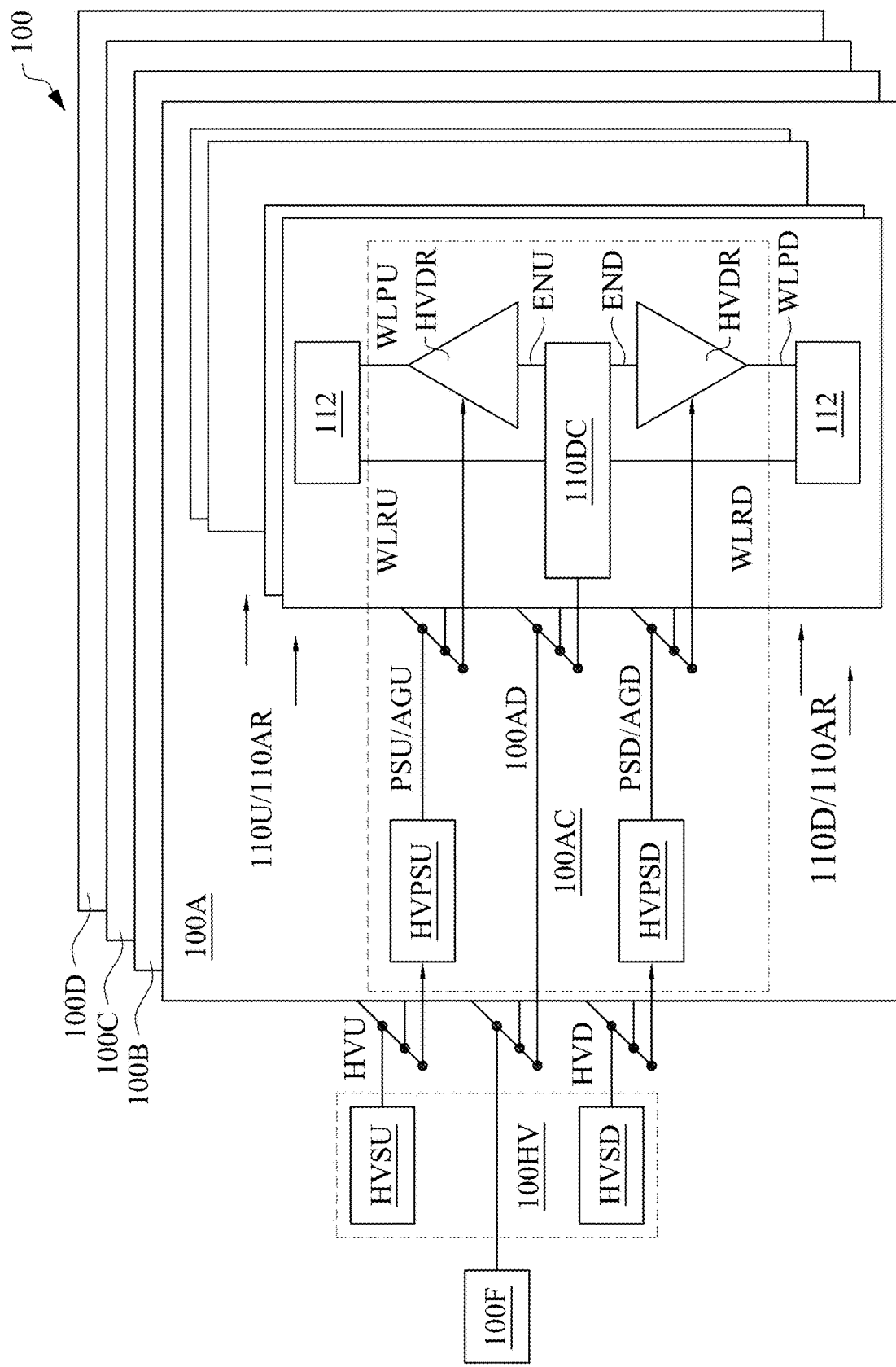

FIGS. 1A and 1B are diagrams of a memory circuit 100, in accordance with some embodiments. FIG. 1A is a block diagram of a non-limiting example of a layout of memory circuit 100 in the x-y plane, indicated by the x-axis and y-axis, and FIG. 1B is a schematic representation of memory circuit 100.

Each of FIGS. 1A and 1B is simplified for the purpose of illustration. In various embodiments, memory circuit 100 includes various elements in addition to those depicted in FIGS. 1A and 1B or is otherwise arranged so as to perform the operations discussed below.

As depicted in FIG. 1A, memory circuit 100 is an IC that includes memory partitions 100A-100D, bit line (BL) drivers 100BL, a global HV switch circuit 100HV, and a functional circuit 100F. Each memory partition 100A-100D includes memory banks 110U and 110D adjacent to a driver circuit 110AC, also referred to as an activation circuit 110AC in some embodiments. Each memory bank 110U and 110D includes an array 110AR and a BL selection circuit 110BS, and each driver circuit 110AC includes a bank decode circuit 110DC.

A memory partition, e.g., memory partition 100A-100D, is a portion of memory circuit 100 that includes a subset of NVM devices (not shown in FIG. 1A) and adjacent circuits configured to selectively access the subset of NVM devices in program and read operations. In the embodiment depicted in FIG. 1A, memory circuit 100 includes a total of four partitions. In various embodiments, memory circuit 100 includes a total number of partitions greater or fewer than four.

BL driver 100BL, is an electronic circuit configured to control access to one or more electrical paths, e.g., bit lines, to each NVM device of the corresponding memory bank 110U or 110D of each memory partition 100A-100D, e.g., by generating one or more control signals. In some embodiments, BL driver 100BL includes a detection circuit (not shown), e.g., a sense amplifier, configured to determine an absolute and/or relative voltage and/or current level of one or more signals received from a selected NVM device.

Global HV switch circuit 100HV is an electronic circuit configured to output HV power signals, each having a voltage level VPP (not shown in FIG. 1A) corresponding to a program operation on an NVM device and a voltage level VRD corresponding to a read operation on an NVM device, voltage level VPP having a magnitude greater than that of voltage level VRD. As further discussed below with respect to FIG. 1B, global HV switch circuit 100HV includes first and second global HV power switches (not depicted in FIG. 1A), each configured to output the HV power signal having voltage levels VPP and VRD to the corresponding memory bank 110U or 110D of each memory partition 100A-100D.

Functional circuit 100F is an electronic circuit configured to control some or all of program and read operations on each memory partition 100A-100D, e.g., by generating and/or outputting one or more control and/or enable signals. In some embodiments, functional circuit 100F includes a control circuit (not shown). In various embodiments, functional circuit 100F includes one or more analog circuits configured to interface with memory partitions 100A-100D, cause data to be programmed in one or more NVM devices, and/or use data received from one or more NVM devices in one or more circuit operations. In some embodiments, functional circuit 100F includes one or more global address decode or pre-decode circuits (not shown in FIG. 1A) configured to output one or more address signals, e.g., address signals 100AD depicted in FIG. 1B, to the activation circuit 110AC of each memory partition 100A-100D.

Each driver circuit 110AC is an electronic circuit including the corresponding bank decode circuit 110DC configured to receive the one or more address signals and generate enable signals corresponding to adjacent subsets of NVM devices identified by the one or more address signals. In some embodiments, the adjacent subsets of NVM devices correspond to columns of NVM devices. In some embodiments, each bank decode circuit 110DC is configured to generate each enable signal as a complementary pair of enable signals. As further discussed below with respect to FIGS. 1A, 1B, and 3A-3B, in various embodiments, each bank decode circuit 110DC is configured to generate each enable signal corresponding to one or both of the adjacent memory banks 110U or 110D of the corresponding memory partition 100A-100D.

Each driver circuit 110AC includes corresponding signal generation circuits (not depicted in FIG. 1A) configured to generate activation signals responsive to the corresponding enable signals, and output the activation signals to the adjacent memory banks 110U and 110D of the corresponding memory partition 100A-100D. As further discussed below with respect to FIG. 1B, each driver circuit 110AC includes a HV power switch and a plurality of HV drivers corresponding to the adjacent memory bank 110U, and a HV power switch and a plurality of HV drivers corresponding to the adjacent memory bank 110D. Each driver circuit 110AC is thereby configured to output a first plurality of HV activation signals to the adjacent memory bank 110U responsive to corresponding enable signals and a first power signal received from the corresponding HV power switch, and output a second plurality of HV activation signals to the adjacent memory bank 110D responsive to corresponding enable signals and a second power signal received from the corresponding HV power switch.

Each memory bank 110U and 110D includes the corresponding BL selection circuit 110BS configured to selectively access one or more bit lines (not shown) coupled to adjacent subsets of NVM devices of the corresponding array 110AR responsive to BL driver 100BL, e.g., based on one or more BL control signals. In some embodiments, the adjacent subsets of NVM devices correspond to rows of NVM devices.

Each memory bank 110U and 110D includes the corresponding array 110AR including NVM devices 112, further discussed below with respect to FIG. 1B, configured to be accessed in program and read operations by the adjacent BL selection circuit 110BS and the adjacent driver circuit 110AC configured as discussed above.

NVM device 112 is an electrical, electromechanical, electromagnetic, or other device configured to store bit data represented by logical states. At least one logical state of an NVM device 112 is capable of being programmed in a write operation and detected in a read operation. In some embodiments, a logical state corresponds to a voltage level of an electrical charge stored in a given NVM device 112. In some embodiments, a logical state corresponds to a physical property, e.g., a resistance or magnetic orientation, of a component of a given NVM device 112.

In various embodiments, NVM devices 112 include one or more OTP memory devices such as electronic fuse (eFuse) or anti-fuse devices, flash memory devices, random-access memory (RAM) devices, resistive RAM devices, ferroelectric RAM devices, magneto-resistive RAM devices, erasable programmable read only memory (EPROM) devices, electrically erasable programmable read only memory (EEPROM) devices, or the like. In some embodiments, an NVM device 112 is an OTP memory device including one or more OTP devices 200 discussed below with respect to FIG. 2.

In FIG. 1B, the schematic representation of memory circuit 100 includes representative features of a single memory partition 100A, and within memory partition 100A, representative features of a portion of each of the corresponding instances of memory banks 110U and 110D and driver circuit 110AC. Each instance of memory bank 110U and 110D includes the corresponding instance of array 110AR including multiple adjacent subsets of NVM devices 112, each adjacent subset represented in FIG. 1B as a single instance of NVM device 112. In some embodiments, each adjacent subset of NVM devices 112 corresponds to a column of NVM devices 112 of a given array 110AR. BL driver 100BL, bit line selection circuits 110BS, and bit lines are not depicted in FIG. 1B for the purpose of clarity.

Functional circuit 100F includes a global decoder (not depicted) coupled to each instance of driver circuit 110AC corresponding to a memory partition 100A-100D. Global HV switch circuit 100HV includes global HV power switches HVSU and HVSD, each of which is coupled to each instance of driver circuit 110AC.

Two or more circuit elements are considered to be coupled based on one or more direct signal connections and/or one or more indirect signal connections that include one or more logic devices, e.g., an inverter or logic gate, between the two or more circuit elements. In some embodiments, signal communications between the two or more coupled circuit elements are capable of being modified, e.g., inverted or made conditional, by the one or more logic devices.

Each instance of driver circuit 110AC includes a HV power switch HVPSU coupled to global HV power switch HVSU and a HV power switch HVPSD coupled to global HV power switch HVSD. Each instance of HV power switch HVPSU is thereby configured to receive a HV power signal HVU from global HV power switch HVSU, and each instance of HV power switch HVPSD is thereby configured to receive a HV power signal HVD from global HV power switch HVSD.

Each portion of each driver circuit 110AC includes a corresponding portion of bank decode circuit 110DC coupled to the global decoder and to the corresponding adjacent subsets of NVM devices 112 of each of memory banks 110U and 110D. Each portion of each driver circuit 110AC also includes two instances of a HV driver HVDR. One instance of HV driver HVDR is coupled to HV power switch HVPSU, the portion of bank decode circuit 110DC, and the adjacent subset of NVM devices 112 of memory bank 110U. The other instance of HV driver HVDR is coupled to HV power switch HVPSD, the portion of bank decode circuit 110DC, and the adjacent subset of NVM devices 112 of memory bank 110D.

Each portion of bank decode circuit 110DC is thereby configured to receive one or more address signals 100AD from the global decoder. Each instance of HV driver HVDR corresponding to memory bank 110U is thereby configured to receive a power signal PSU and a ground signal AGU from HV power switch HVPSU, and an enable signal ENU from the portion of bank decode circuit 110DC. Each instance of HV driver HVDR corresponding to memory bank 110D is thereby configured to receive a power signal PSD and a ground signal AGD from HV power switch HVPSD, and an enable signal END from the portion of bank decode circuit 110DC.

Each subset of NVM devices 112 of memory bank 110U is thereby configured to receive an activation signal WLRU from the corresponding portion of bank decode circuit 110DC and a HV activation signal WLPU from the corresponding HV driver HVDR, and each subset of NVM devices 112 of memory bank 110D is thereby configured to receive an activation signal WLRD from the corresponding portion of bank decode circuit 110DC and a HV activation signal WLPD from the corresponding HV driver HVDR.

Each global HV power switch HVSU and HVSD is an electronic circuit including at least one switching device (not shown in FIG. 1B) and configured to generate the corresponding HV power signal HVU or HVD having voltage levels VPP and VRD corresponding to respective program and read operations on NVM devices 112. In various embodiments, each global HV power switch HVSU and HVSD is configured to output the corresponding HV power signal HVU or HVD having either a positive or negative polarity with respect to a ground voltage level.

In operation, global HV power switch HVSU is configured to generate HV power signal HVU having voltage level VPP in response to a first enable signal (not shown) indicating the program operation being performed on an NVM device in one of memory banks 110U, and otherwise having voltage level VRD. Global HV power switch HVSD is configured to generate HV power signal HVD having voltage level VPP in response to a second enable signal (not shown) indicating the program operation being performed on an NVM device in one of memory banks 110D, and otherwise having voltage level VRD. In some embodiments, the first and second enable signals are received from functional circuit 100F.

In some embodiments, global HV power switches HVSU and HVSD are a same global HV power switch configured to generate HV power signals HVU and HVD as a same HV power signal, the same HV power signal having voltage level VPP in response to a single enable signal, e.g., received from functional circuit 100F, indicating the program operation being performed on an NVM device in one of memory banks 110U or 110D, and otherwise having voltage level VRD.

In some embodiments, each global HV power switch HVSU and HVSD is configured to generate the corresponding HV power signal HVU or HVD having voltage level VPP ranging from 3 volts (V) to 8 V. In some embodiments, each global HV power switch HVSU and HVSD is configured to generate the corresponding HV power signal HVU or HVD having voltage level VPP ranging from 4 V to 6 V. In some embodiments, each global HV power switch HVSU and HVSD is configured to generate the corresponding HV power signal HVU or HVD having voltage level VPP approximately equal to 4.8 V.

In some embodiments, each global HV power switch HVSU and HVSD is configured to generate the corresponding HV power signal HVU or HVD having voltage level VRD ranging from 0.8 V to 3 V. In some embodiments, each global HV power switch HVSU and HVSD is configured to generate the corresponding HV power signal HVU or HVD having voltage level VRD ranging from 1 V to 1.8 V. In some embodiments, each global HV power switch HVSU and HVSD is configured to generate the corresponding HV power signal HVU or HVD having voltage level VRD approximately equal to 1.35 V.

In some embodiments, a global HV power switch HVSU and/or HVSD includes a global HV power switch 750, discussed below with respect to FIGS. 7A-7C.

Each instance of HV power switch HVPSU and HVPSD is an electronic circuit including at least one switching device (not shown in FIG. 1B) and configured to receive the corresponding HV power signal HVU or HVD, a MV power signal, a LV power signal, and a HV enable signal (not shown in FIG. 1B), and generate corresponding power/ground signals PSU/AGU or PSD/AGD having one of a first or second pair of voltage levels responsive to the HV enable signal.

A MV power signal is a power signal having a predetermined MV level between voltage level VPP and the ground voltage level. In some embodiments, the predetermined MV level is between voltage levels VPP and VRD. In some embodiments, a difference between voltage level VPP and the predetermined MV level has a value configured to avoid overstressing transistors in HV driver HVDR, e.g., transistors P1, P2, N4, and N5 of a HV driver 400 discussed below with respect to FIG. 4.

In some embodiments, the predetermined MV level has a value ranging from 2.5 V to 3 V. In some embodiments, the predetermined MV level is approximately equal to 2.7 V.

A LV power signal is a power signal having a predetermined LV level between voltage level VRD and the ground voltage level. In some embodiments, the LV power signal is a power supply voltage of memory circuit 100. In some embodiments, the predetermined LV level corresponds to a high logical state of various signals, e.g., an enable signal, of memory circuit 100 and the ground voltage level corresponds to a low logical state of the various signals.

In some embodiments, the predetermined LV level has a value ranging from 0.8 V to 1.8V. In some embodiments, the predetermined LV level is approximately equal to 1.2 V.

The HV enable signal is configured to have a first logical state corresponding to none of the NVM devices 112 in the corresponding memory bank 110U or 110D being accessed in a program or read operation, and a second logical state corresponding to an NVM device 112 in the corresponding memory bank 110U or 110D being accessed in a program or read operation. In some embodiments, the HV enable signal is received from functional circuit 100F.

In operation, in response to the HV enable signal having the first logical state, each instance of HV power switch HVPSU and HVPSD is configured to generate the corresponding power signal PSU or PSD having a voltage level of the LV power signal and the corresponding ground signal AGU or AGD having the ground voltage level. In response to the HV enable signal having a second logical state, each instance of HV power switch HVPSU and HVPSD is configured to generate corresponding power signal PSU or PSD having the voltage level VPP or VRD of the corresponding HV power signal HVU or HVD.

In response to the HV enable signal having the second logical state, each instance of HV power switch HVPSU and HVPSD is configured to generate corresponding ground signal AGU or AGD having either the ground voltage level or a voltage level of the MV power signal further based on the voltage level of the corresponding HV power signal HVU or HVD. Each instance of HV power switch HVPSU and HVPSD is configured to generate corresponding ground signal AGU or AGD having the voltage level of the MV power signal when the corresponding HV power signal HVU or HVD has voltage level VPP, and having the ground voltage level when the corresponding HV power signal HVU or HVD has voltage level VRD.

In some embodiments, a HV power switch HVPSU and/or HVPSD includes a detection circuit configured to control generation of the corresponding ground signal AGU or AGD based on detecting the voltage level of the corresponding HV power signal HVU or HVD. In some embodiments, a HV power switch HVPSU and/or HVPSD includes a HV power switch 500 discussed below with respect to FIGS. 5A and 5B or a HV power switch 700 discussed below with respect to FIGS. 7A-7C.

In some embodiments, a HV power switch HVPSU and/or HVPSD includes a delay and level shifter circuit configured to control generation of the corresponding ground signal AGU or AGD based on the HV enable signal and one or more additional signals. In some embodiments, a HV power switch HVPSU and/or HVPSD includes a HV power switch 600 discussed below with respect to FIGS. 6A and 6B.

Bank decode circuit 110DC is an electronic circuit in which each portion includes one or more logic gates (not shown) configured to generate corresponding enable signals ENU and END responsive to address signals 100AD. Each portion of bank decode circuit 110DC is configured to generate the corresponding enable signals ENU and END having logical states configured to cause the corresponding subsets of NVM devices 112 identified by address signals 100AD to be activated in program and read operations. In some embodiments, each portion of bank decode circuit 110DC is configured to generate the corresponding enable signals ENU and END as complementary pairs, each pair being represented in FIG. 1B as enable signal ENU or END.

In the embodiment depicted in FIG. 1B, each portion of bank decode circuit 110DC is configured to generate and output activation signal WLRU to the corresponding subset of NVM devices 112 of memory bank 110U and to generate and output activation signal WLRD to the corresponding subset of NVM devices 112 of memory bank 110D. Each portion of bank decode circuit 110DC is configured to output each activation signal WLRU and WLRD having logical states configured to activate the corresponding subset of NVM devices 112 in program and read operations in accordance with the logical states of respective enable signals ENU and END. In some embodiments, each portion of bank decode circuit 110DC is configured to generate and output activation signal WLRU as a same signal as some or all of enable signal ENU and to generate and output activation signal WLRD as a same signal as some or all of enable signal END.

In some embodiments, each driver circuit 110AC includes the portions of bank decode circuit 110DC otherwise configured to cause the corresponding subsets of NVM devices 112 identified by address signals 100AD to be activated in program and read operations, e.g., by including a buffer and/or inverter (not shown) coupled between each portion of bank decode circuit 110DC and the corresponding subsets of NVM devices 112, the buffer and/or inverter being configured to generate the corresponding activation signal WLRU or WLRD responsive to the respective enable signal ENU or END.

In some embodiments, each portion of bank decode circuit 110DC includes a single decoder configured to generate enable signals ENU and END as a same enable signal and generate activation signals WLRU and WLRD as a same activation signal based on address signals 100AD identifying either adjacent subset of NVM devices 112 as being activated in program and read operations. In some embodiments, each portion of bank decode circuit 110DC includes a decode circuit 300A discussed below with respect to FIG. 3A.

In some embodiments, each portion of bank decode circuit 110DC includes a first decoder configured to generate enable signal ENU and activation signal WLRU based on address signals 100AD identifying the subset of NVM devices 112 of adjacent memory bank 110U as being activated in program and read operations, and a second decoder configured to generate enable signal END and activation signal WLRD based on address signals 100AD identifying the subset of NVM devices 112 of adjacent memory bank 110DU as being activated in program and read operations. In some embodiments, each portion of bank decode circuit 110DC includes a decode circuit 300B discussed below with respect to FIG. 3B.

Each instance of HV driver HVDR is an electronic circuit including a plurality of transistors (not shown in FIG. 1B) configured to generate and output HV activation signal WLPU or WLPD responsive to the corresponding enable signal ENU and power/ground signals PSU/AGU or enable signal END and power/ground signals PSD/AGD.

Each instance of HV driver HVDR is configured to, in response to the corresponding enable signal ENU or END having the logical state(s) configured to cause the corresponding subset of NVM devices 112 to be activated in a program or read operation, generate the corresponding HV activation signal WLPU or WLPD having the voltage level of the corresponding power signal PSU or PSD, and otherwise generate the corresponding HV activation signal WLPU or WLPD having the ground voltage level.

In some embodiments, HV driver HVDR includes HV driver 400 discussed below with respect to FIG. 4.

As discussed above, each instance of HV power switch HVPSU and HVPSD is configured to output the corresponding power signal PSU or PSD having voltage level VPP in response to the program operation being performed on an NVM device 112 in the corresponding memory bank 110U or 110D, voltage level VRD in response to the read operation being performed on an NVM device 112 in the corresponding memory bank 110U or 110D, and the voltage level of the LV power signal otherwise.

In embodiments in which each portion of bank decode circuit 110DC is configured to generate enable signals ENU and END as a same enable signal, each instance of HV driver is thereby configured to output the corresponding HV activation signal WLPU or WLPD having voltage level VPP or VRD of the corresponding power signal PSU or PSD in response to the program or read operation being performed on an NVM device in the subset of NVM devices in the corresponding one of the memory banks 110U and 110D adjacent to driver circuit 110AC, and having the voltage level of the LV power signal in response to the program or read operation being performed on an NVM device in the subset of NVM devices in the other one of the memory banks 110U and 110D adjacent to driver circuit 110AC.

In embodiments in which each portion of bank decode circuit 110DC is configured to generate enable signals ENU and END as separate enable signals, each instance of HV driver is thereby configured to output the corresponding HV activation signal WLPU or WLPD having voltage level VPP or VRD of the corresponding power signal PSU or PSD in response to the program or read operation being performed on an NVM device in the subset of NVM devices in the corresponding one of the memory banks 110U and 110D adjacent to driver circuit 110AC, and having the ground voltage level in response to the program or read operation being performed on an NVM device in the subset of NVM devices in the other one of the memory banks 110U and 110D adjacent to driver circuit 110AC.

Accordingly, during program and read operations, subsets of NVM devices in the non-selected one of adjacent banks 110U and 110D are configured to receive the corresponding HV activation signal WLPU or WLPD having either the LV or ground voltage level. Compared to approaches in which NVM devices in non-selected adjacent banks receive program and read voltage levels during program and read operations on selected adjacent banks, sometimes referred to as disturb events, NVM device current leakage levels are reduced, thereby reducing power consumption, and HV stresses are reduced, thereby improving NVM device reliability.

In some embodiments, each HV power switch HVPSU and HVPSD is configured to cause the corresponding HV drivers HVDR to generate HV activation signal WLPU or WLPD by switching ground signal AGU or AGD from the ground voltage level to the MV level. Compared to approaches that do not include switching a ground signal from a ground voltage level to a MV level, HV drivers HVDR are thereby capable of including fewer cascode transistors such that area requirements are reduced.

Figure 2:
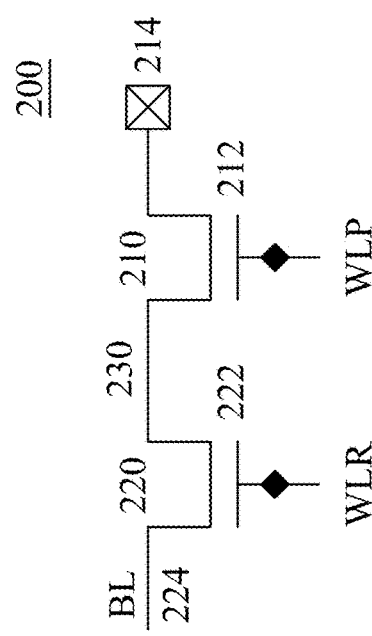
FIG. 2 is a diagram of a memory device, in accordance with some embodiments.

FIG. 2 is a schematic diagram of OTP device 200, in accordance with some embodiments. OTP device 200, also referred to as an anti-fuse device 200 in some embodiments, is usable as some or all of NVM device 112 discussed above with respect to FIGS. 1A and 1B.

OTP device 200 includes a program transistor 210 and a read transistor 220. Program transistor 210 includes a gate 212 and a source/drain (S/D) terminal 214, read transistor 220 includes a gate 222 and a S/D terminal 224, and program transistor 210 and read transistor 220 share a S/D terminal 230.

In the embodiment depicted in FIG. 2, each of program transistor 210 and read transistor 220 is an NMOS transistor. In some embodiments, one or both of program transistor 210 or read transistor 220 is a PMOS transistor.

Gate 212 is coupled to an instance of HV driver HVDR and is thereby configured to receive a HV activation signal WLP corresponding to one of HV activation signals WLPU or WLPD as discussed above. S/D terminal 214 is electrically isolated from circuit elements external to transistor 210 and is thereby considered to have a floating voltage level.

Gate 222 is coupled to a portion of an instance of bank decode circuit 110DC and is thereby configured to receive HV activation signal WLR corresponding to one of activation signals WLRU or WLRD as discussed above. S/D terminal 224 is coupled to a bit line and thereby configured to receive a bit line signal BL as discussed above.

S/D terminal 230 is electrically isolated from elements external to transistors 210 and 220 and is thereby configured as a conductive path between transistors 210 and 220.

Each of gates 212 and 222 shares an electrical connection with corresponding gates of other instances (not shown) of OTP device 200 such that a corresponding subset, e.g., column, of OTP devices 200 is configured to receive the same instances of activation signal WLRU or WLRD and HV activation signal WLPU or WLPD. S/D terminal 224 shares an electrical connection with corresponding S/D terminals of other instances (not shown) of OTP device 200 such that a corresponding subset, e.g., row, of OTP devices 200 is configured to receive the same instance of bit line signal BL. Each instance of OTP device 200 is thereby configured to receive a unique combination of activation signal WLR, HV activation signal WLP, and bit line signal BL.

In program and read operations on OTP device 200, HV activation signal WLP is applied to gate 212, transistor 220 is turned on responsive to signal WLR applied to gate 222 and bit line signal BL having the ground voltage level.

Prior to a program operation, a dielectric layer of gate 212 is configured as an insulator having a high resistance that represents a logically high level in some embodiments. During the program operation, HV activation signal WLP has voltage level VPP discussed above whereby a difference between the first voltage level and the ground voltage level produces an electric field across a dielectric layer of gate 212 sufficiently large to sustainably alter the dielectric material such that a resultant lowered resistance represents a logically low level in some embodiments.

In a read operation, HV activation signal WLP has voltage level VRD discussed above whereby a difference between the second voltage level and the ground voltage level produces an electric field that is sufficiently small to avoid sustainably altering the dielectric material of gate 212 and sufficiently large to generate a current flowing through S/D terminals 230 and 224 and having a magnitude capable of being sensed by a sense amplifier (not shown) and thereby used to determine a programmed status of OTP device 200.

By the configuration discussed above, OTP device 200 is capable of being programmed and read responsive to activation signals WLRU and WLRD and HV activation signals WLPU and WLPD in accordance with the discussion above with respect to memory circuit 100 and FIGS. 1A and 1B such that memory circuit 100 including OTP devices 200 is capable of realizing the benefits discussed above.

Figure 3A:
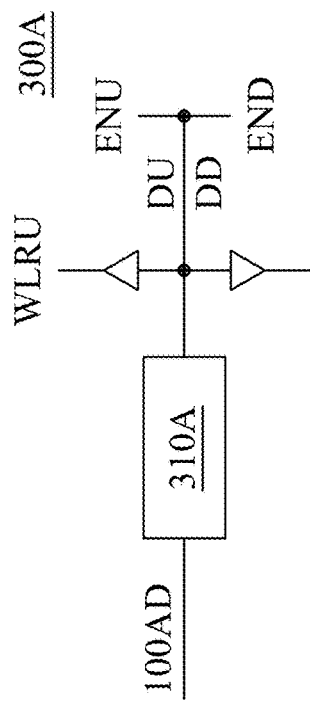
FIGS. 3A and 3B are diagrams of decode circuits, in accordance with some embodiments.
Figure 3B:
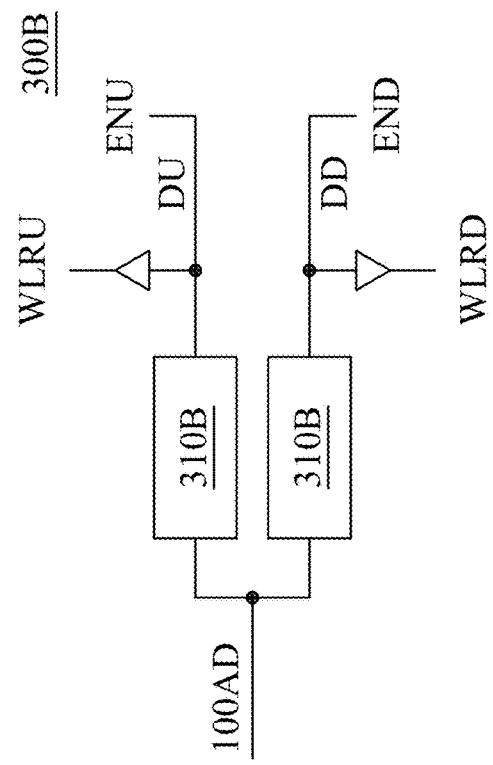

FIGS. 3A and 3B are diagrams of decode circuits 300A and 300B, in accordance with some embodiments. Each of decode circuits 300A and 300B is usable as a portion of bank decode circuit 110DC discussed above with respect to FIGS. 1A and 1B. Decode circuit 300A corresponds to embodiments in which the portion of bank decode circuit 110DC is configured to output enable/activation signals ENU/WLRU and END/WLRD as same enable/activation signals, and decode circuit 300B corresponds to embodiments in which the portion of bank decode circuit 110DC is configured to output enable/activation signals ENU/WLRU and END/WLRD as separate enable/activation signals.

Decode circuit 300A includes a decoder 310A coupled to drivers DU and DD, decoder 310A being configured to receive address signals 100AD and output a single enable signal ENU/END.

A decoder, e.g., decoder 310A, is a logic circuit configured to generate an enable signal, e.g., enable signal ENU and/or END, having a first logical state based on received signals, e.g., address signals 100AD, having a predetermined combination of logical states, e.g., corresponding to an address of a subset of NVM devices 112, and otherwise having a second logical state. In some embodiments, a decoder is configured to generate the enable signal as a complementary pair. In some embodiments, a decoder includes a combination of logic gates, e.g., inverters and/or NAND, NOR, and/or other suitable gates.

A driver, e.g., driver DU or DD, is an electronic circuit configured to generate an activation signal, e.g., activation signal WLRU or WLRD, having a logical state based on the logical state(s) of a received signal, e.g., enable signal ENU or END, and a maximum voltage level based on a received power signal. In various embodiments, the maximum voltage level of the activation signal is equal to or greater than that of the received signal. In various embodiments, a driver includes one or more inverters and/or buffers. In some embodiments, a driver includes an output inverter or buffer configured to generate the activation signal including a drive current configured to charge a combined capacitance of a subset, e.g., column, of NVM devices.

In the embodiment depicted in FIG. 3A, each driver DU and DD is configured to receive a single enable signal ENU/END from decoder 310A, and generate corresponding activation signals WLRU and WLRD as a same activation signal. In some embodiments, drivers DU and DD are configured to generate corresponding activation signals WLRU and WLRD based on receiving enable signal ENU/END from decoder 310A as a complementary pair. In some embodiments, each driver DU and DD is configured to receive a single enable signal ENU/END from decoder 310A, and generate a complementary signal whereby enable signal ENU/END is output from decode circuit 300A as a complementary pair. In some embodiments, decode circuit 300A does not include drivers DU and DD, and is configured to output enable signal ENU/END as activation signal WLRU/WLRD.

Decode circuit 300A is thereby configured to generate enable signal ENU/END and activation signal WLRU/WLRD, if applicable, responsive to memory signals 100AD being configured to indicate performance of a program or read operation on an NVM device 112 in either one of a subset of NVM devices 112 in an adjacent memory bank 110U or a subset of NVM devices 112 in an adjacent memory bank 110D.

Decode circuit 300B includes a decoder 310B coupled to driver DU and a decoder 310B coupled to driver DD, each instance of decoder 310B being configured to receive address signals 100AD. A first instance of decoder 310B is configured to output enable signal ENU and a second instance of decoder 310B is configured to output enable signal END. Drivers DU and DD are configured to receive separate enable signals ENU and END from the instances of decoder 310B, and generate corresponding separate activation signals WLRU and WLRD. In some embodiments, drivers DU and DD are configured to generate corresponding activation signals WLRU and WLRD based on receiving enable signals ENU and END from decoders 310B as complementary pairs. In some embodiments, each driver DU and DD is configured to receive a single enable signal ENU or END from the corresponding decoder 310B, and generate a complementary signal whereby each enable signal ENU or END is output from decode circuit 300B as a complementary pair. In some embodiments, decode circuit 300B does not include drivers DU and DD, and is configured to output enable signals ENU and END as activation signals WLRU and WLRD.

Decode circuit 300B is thereby configured to generate enable signal ENU and activation signal WLRU, if applicable, responsive to memory signals 100AD being configured to indicate performance of a program or read operation on an NVM device 112 in a subset of NVM devices 112 in an adjacent memory bank 110U and to generate enable signal END and activation signal WLRD, if applicable, responsive to memory signals 100AD being configured to indicate performance of a program or read operation on an NVM device 112 in a subset of NVM devices 112 in an adjacent memory bank 110D.

By the configurations discussed above, each of decode circuits 300A and 300B is capable of generating enable signals ENU and END and activation signals WLRU and WLRD in accordance with the discussion above with respect to bank decode circuit 110DC and FIGS. 1A and 1B such that memory circuit 100 including decode circuits 300A or 300B is capable of realizing the benefits discussed above.

Figure 4:
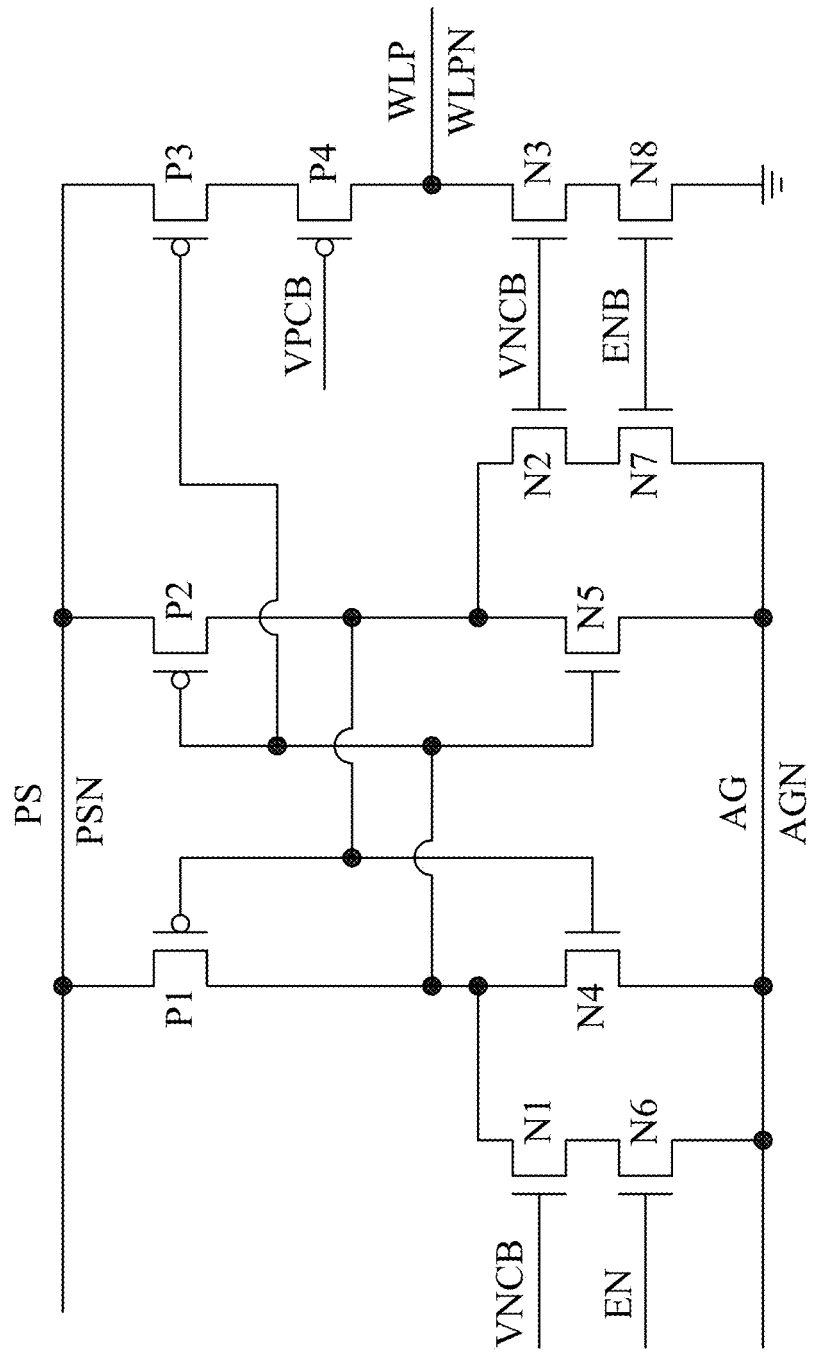
FIG. 4 is a diagram of a high-voltage (HV) driver, in accordance with some embodiments.

FIG. 4 is a diagram of HV driver 400, in accordance with some embodiments. HV driver 400, also referred to as a hybrid latch 400 or a two-phase hybrid latch 400 in some embodiments, is usable as some or all of HV driver HVDR discussed above with respect to FIGS. 1A and 1B.

HV driver 400 includes a power signal node PSN configured to receive a power signal PS corresponding to one of power signals PSU or PSD, a ground node AGN configured to receive a ground signal AG corresponding to one of ground signals AGU or AGD, and an output node WLPN configured to output a HV activation signal WLP corresponding to one of HV activation signals WLPU or WLPD, each discussed above with respect to FIGS. 1A and 1B.

A PMOS transistor P1 and an NMOS transistor N4 are coupled in series between power signal node PSN and ground node AGN, a PMOS transistor P2 and an NMOS transistor N5 are coupled in series between power signal node PSN and ground node AGN, gates of transistors P1 and N4 are coupled to each other and to source terminals of transistors P2 and N5, and gates of transistors P2 and N5 are coupled to each other and to source terminals of transistors P1 and N4. PMOS transistors P1 and P2 and NMOS transistors N4 and N5 are thereby arranged as a latch circuit configured to latch one pair of coupled gates of transistors P1 and N4 or P2 and N5 to the voltage level of power signal PS and the other pair of coupled gates of transistors P1 and N4 or P2 and N5 to the voltage level of ground signal AG.

NMOS transistors N1 and N6 are coupled in series, the series being arranged in parallel with NMOS transistor N4, and NMOS transistors N2 and N7 are coupled in series, the series being arranged in parallel with NMOS transistor N5. PMOS transistors P3 and P4 are coupled in series between power signal node PSN and output node WLRN, and NMOS transistors N3 and N8 are coupled in series between output node WLRN and a ground reference node configured to have the ground voltage level. A gate of PMOS transistor P3 is coupled to the pair of coupled gates of transistors P2 and N5.

PMOS transistor P4 is configured to receive a cascode bias voltage VPCB, and each of NMOS transistors N1-N3 is configured to receive a cascode bias voltage VNCB. NMOS transistor N6 is configured to receive an enable signal EN corresponding to one of enable signals ENU or END discussed above with respect to FIGS. 1A, 1B, 3A, and 3B, and transistors N7 and N8 are configured to receive an enable signal ENB complementary to enable signal EN.

Cascode bias voltage VPCB has a voltage level relative to the voltage level of power signal PS configured to maintain a voltage drop across elements of PMOS transistor P3 at or below a predetermined PMOS overstress level, and cascode bias voltage VNCB has a voltage level relative to the voltage level of ground signal AG configured to maintain a voltage drop across elements of each of NMOS transistors N1-N3 at or below a predetermined NMOS overstress level.

Enable signals EN/ENB are configured to have a high/low logical state combination when an NVM device coupled to output node WLPN is selected in a program or read operation, and otherwise have a low/high logical state combination.

HV driver 400 is thereby configured to, in operation, respond to enable signals EN/ENB having the low/high logical state combination by switching off NMOS transistor N6 and switching on NMOS transistors N7 and N8, thereby causing the coupled gates of transistors P1 and N4 to have the voltage level of ground signal AG and the coupled gates of transistors P2, P3, and N5 to have the voltage level of power signal PS. The voltage levels cause PMOS transistor P3 to be switched off and NMOS transistor N8 to be switched on, thereby decoupling output node WLPN from power signal node PSN and coupling output node WLPN to the ground reference node, causing HV activation signal WLP to have the ground voltage level.

In response to enable signals EN/ENB having the high/low logical state combination, HV driver 400 is thereby configured to switch on NMOS transistor N6 and switch off NMOS transistors N7 and N8, thereby causing the coupled gates of transistors P1 and N4 to have the voltage level of power signal PS and the coupled gates of transistors P2, P3, and N5 to have the voltage level of ground signal AG. The voltage levels cause PMOS transistor P3 to be switched on and NMOS transistor N8 to be switched off, thereby decoupling output node WLPN from the ground reference node and coupling output node WLPN to power signal node PSN, causing HV activation signal WLP to have the voltage level of power signal PS.

As discussed above, each HV power switch HVPSU and HVPSD is configured to output corresponding power/ground signals PSU/AGU or PSD/AGD having voltage level VPP or VRD/MV power signal voltage level in response to an NVM device in a corresponding memory bank 110U or 110D being selected in a program or read operation, and otherwise having the LV power voltage level/ground voltage level. Thus, enable signals EN/ENB having the high/low logical state combination occurs when power/ground signals PS/AG have voltage level VPP or VRD/MV power signal voltage level such that HV activation signal WLP is output on output node WLPN having voltage level VPP in program operations and voltage level VRD in read operations.

When enable signals EN/ENB have the low/high logical state combination, activation signal WLP is output on output node WLPN having the ground voltage level independent of the voltage levels of the corresponding power/ground signals PSU/AGU or PSD/AGD received as power/ground signals PS/AG.

Program operations of HV driver 400 are further discussed below with respect to FIGS. 5A-7C. Each of FIGS. 5A, 6A, 7A, and 7C is a circuit diagram of a portion of memory circuit 100 simplified for the purpose of illustration. Each of FIGS. 5B, 6B, and 7B is a diagram of corresponding memory circuit parameters. The parameters depicted in FIGS. 5B, 6B, and 7B are non-limiting examples presented for the purpose of illustration. In various embodiments, memory circuit 100 includes operating parameters other than those depicted in FIGS. 5B, 6B, and 7B whereby a program operation is performed as discussed herein.

Figure 5A:
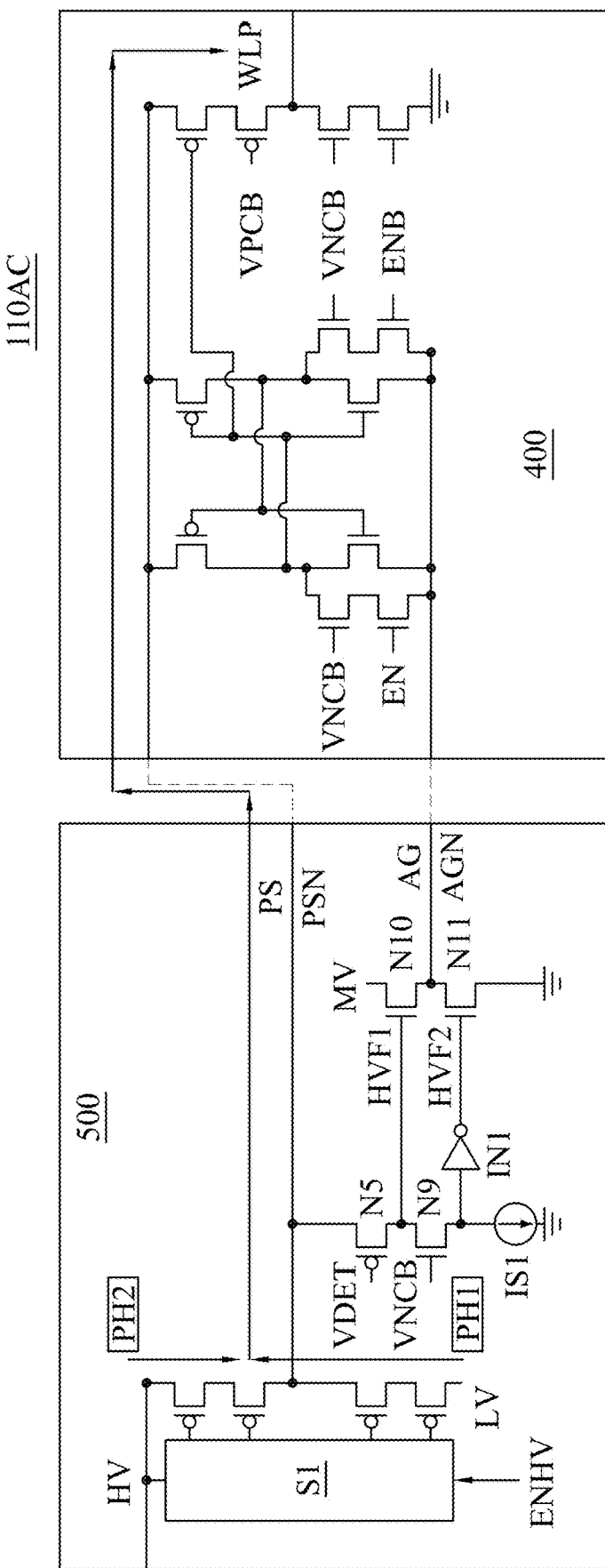
FIG. 5A is a diagram of a driver circuit, in accordance with some embodiments.
Figure 5B:
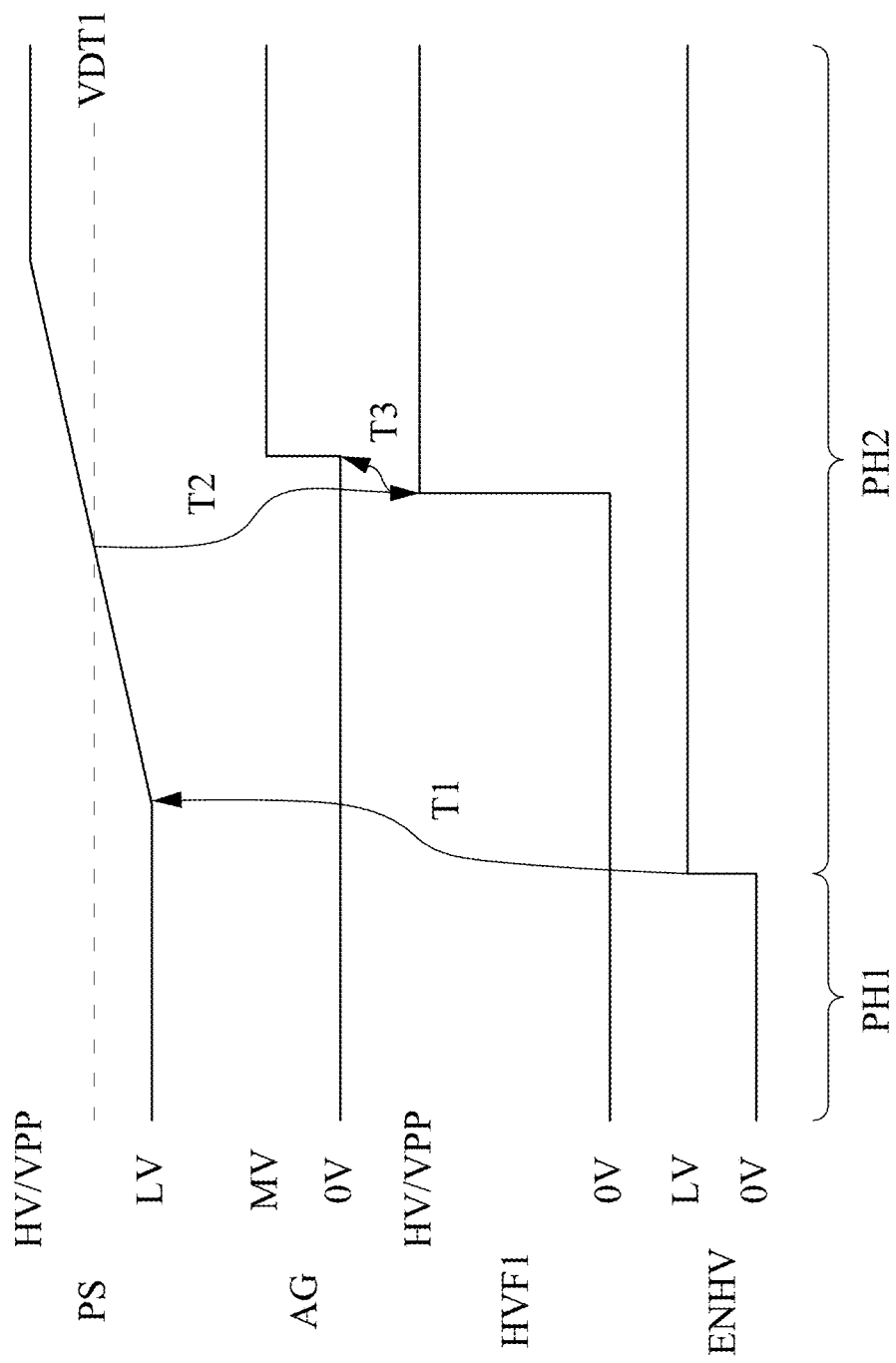
FIG. 5B is a diagram of driver circuit parameters, in accordance with some embodiments.

FIG. 5A is a diagram of driver circuit 110AC, and FIG. 5B is a diagram of corresponding driver circuit parameters, in accordance with some embodiments. In the non-limiting example depicted in FIG. 5A, driver circuit 110AC includes HV driver 400 discussed above with respect to FIG. 4, and HV power switch 500 usable as HV power switch HVPSU or HVPSD discussed above with respect to FIG. 1B. For the purpose of illustration, FIG. 5A includes a simplified version of HV driver 400.

HV power switch 500 includes a level shifter/power switch S1 coupled to power signal node PSN of HV driver 400. A PMOS transistor P5, NMOS transistor N9, and current source IS1 are coupled in series between power signal node PSN and the ground reference node, and NMOS transistors N10 and N11 are coupled in series between power signal node/signal MV and the ground reference node. A junction between transistors P5 and N9 is coupled to a gate of NMOS transistor N10, and an inverter IN1 includes an input terminal coupled to a junction between NMOS transistor N9 and current source IS1, and an output terminal coupled to a gate of NMOS transistor N11. A junction between NMOS transistors N10 and N11 is coupled to ground node AGN of HV driver 400.

Level shifter/power switch S1 is an electronic circuit configured to receive a HV enable signal ENHV, LV power signal LV, and a HV power signal HV corresponding to HV power signal HVU or HVD, each discussed above with respect to FIG. 1B. A level shifting portion is configured to control gates of a plurality of transistors (not labeled) responsive to enable signal ENHV shifted in accordance with voltage level VPP or VRD of HV power signal HV. Level shifter/power switch S1 is thereby configured to, in operation, output power signal PS on power signal node PSN having one of voltage levels VPP or VRD of HV power signal HV or the voltage level of LV power signal LV.

A gate of PMOS transistor P5 is configured to receive a reference voltage VDET, a gate of NMOS transistor N9 is configured to receive cascode bias voltage VNCB, and current source IS1 is configured to limit current conducted through transistors P5 and N9 when each of transistors P5 and N9 is switched on during a program operation as discussed below.

Transistors P5 and N9 and current source IS1 are thereby arranged as a HV level detector configured to, in operation, generate a signal HVF1 at the gate of NMOS transistor N10 and a signal HVF2 at the gate of NMOS transistor N11 responsive to the voltage level of power signal PS relative to those of reference voltage VDET and cascode bias voltage VNCB. NMOS transistors N10 and N11 are thereby arranged as a ground signal switch configured to output ground signal AG on ground node AGN responsive to voltage levels of signals HVF1 and HVF2 relative to the voltage level of MV power signal MV and the ground voltage level.

Operation of HV power switch 500 is further discussed with reference to FIG. 5B. FIG. 5B includes power signal PS, ground signal AG, signal HVF1, and HV enable signal ENHV plotted over time (not labeled). Power signal PS is plotted relative to a reference voltage VDT1 corresponding to reference voltage VDET plus a threshold voltage of PMOS transistor P5. In some embodiments, HV power switch 500 and reference voltage VDET are configured such that reference voltage VDT1 has a voltage level approximately equal to half of voltage level VPP. A program operation is divided into a first phase PH1 followed by a second phase PH2.

At the beginning of phase PH1 of a program operation, enable signals EN/ENB have the high/low logical state combination, thereby causing HV activation signal WLP to have the voltage level of power signal PS as discussed above with respect to FIG. 4. Based on HV enable signal ENHV having the ground voltage level, power signal PS has voltage level LV such that PMOS transistor P5 is switched off, signal HVF1 has the low logical state such that NMOS transistor N10 is switched off, signal HVF2 has the high logical state such that NMOS transistor N11 is switched on, ground signal node AGN is decoupled from voltage node/level MV and coupled to the ground reference node, and ground signal AG has the ground voltage level. As depicted in FIGS. 5A and 5B, HV power switch 500 is thereby controlled to output power signal PS having voltage level LV, and HV driver 400 is thereby set to output HV activation signal WLP having voltage level LV.

At the end of phase PH1 and beginning of phase PH2, HV enable signal ENHV switches from the ground voltage level to voltage level LV, thereby causing level shifter/power switch S1 to ramp output power signal PS from voltage level LV toward voltage level VPP of HV power signal HV (corresponding to the program operation), depicted as transition T1.

Power signal PS increasing above reference voltage VDT1 causes PMOS transistor P5 to switch on such that signal HVF1 has voltage level VPP of HV power signal HV (and signal HVF2 to have the ground voltage level), depicted as transition T2. Signal HVF1 having voltage level VPP of HV power signal HV causes NMOS transistor to switch on (and signal HVF2 having the ground voltage level causes NMOS transistor P11 to switch off) such that ground signal node AGN is coupled to voltage node/level MV and decoupled from the ground reference node, and signal AG is output as voltage level MV, depicted as transition T3.

At the end of phase PH2, power signal PS has voltage level VPP of HV power signal HV. As depicted in FIGS. 5A and 5B, HV power switch 500 is thereby controlled to output power signal PS having voltage level VPP of HV power signal HV, and HV driver 400 thereby latches output HV activation signal WLP at voltage level VPP of HV power signal HV while receiving ground signal AG having voltage level MV.

Figure 6A:
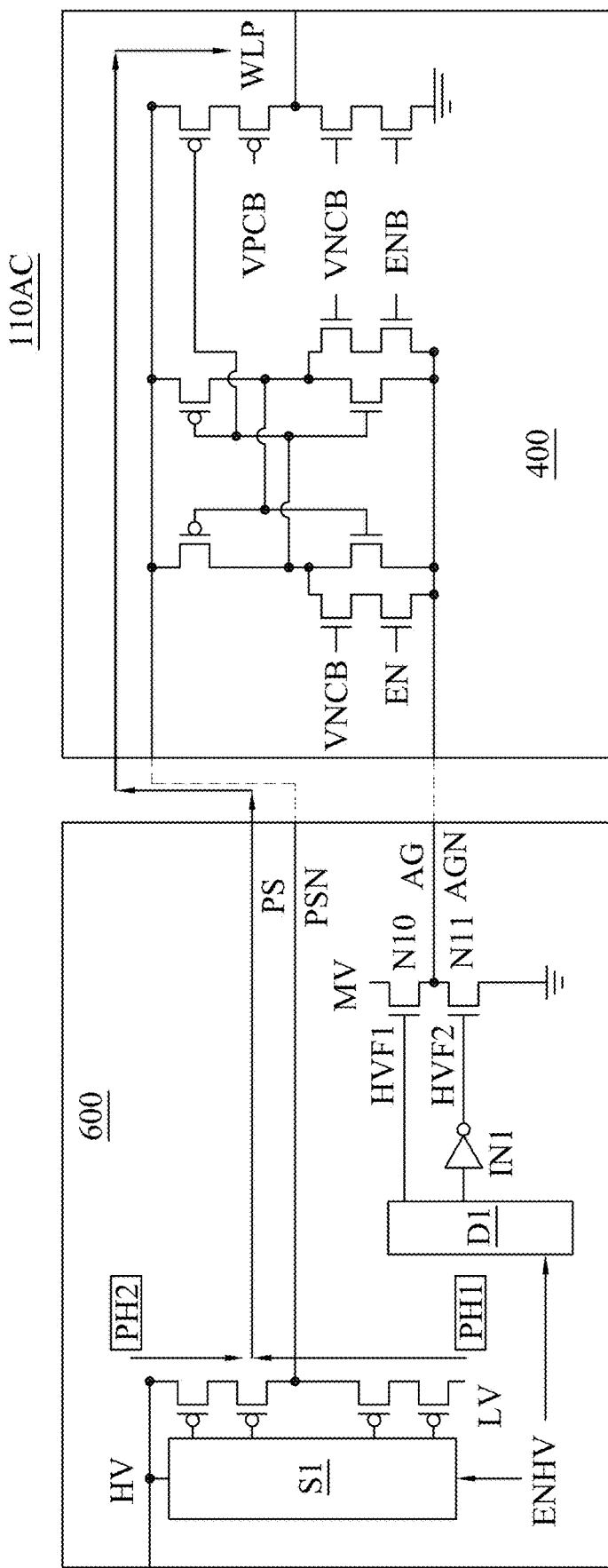
FIG. 6A is a diagram of a driver circuit, in accordance with some embodiments.
Figure 6B:
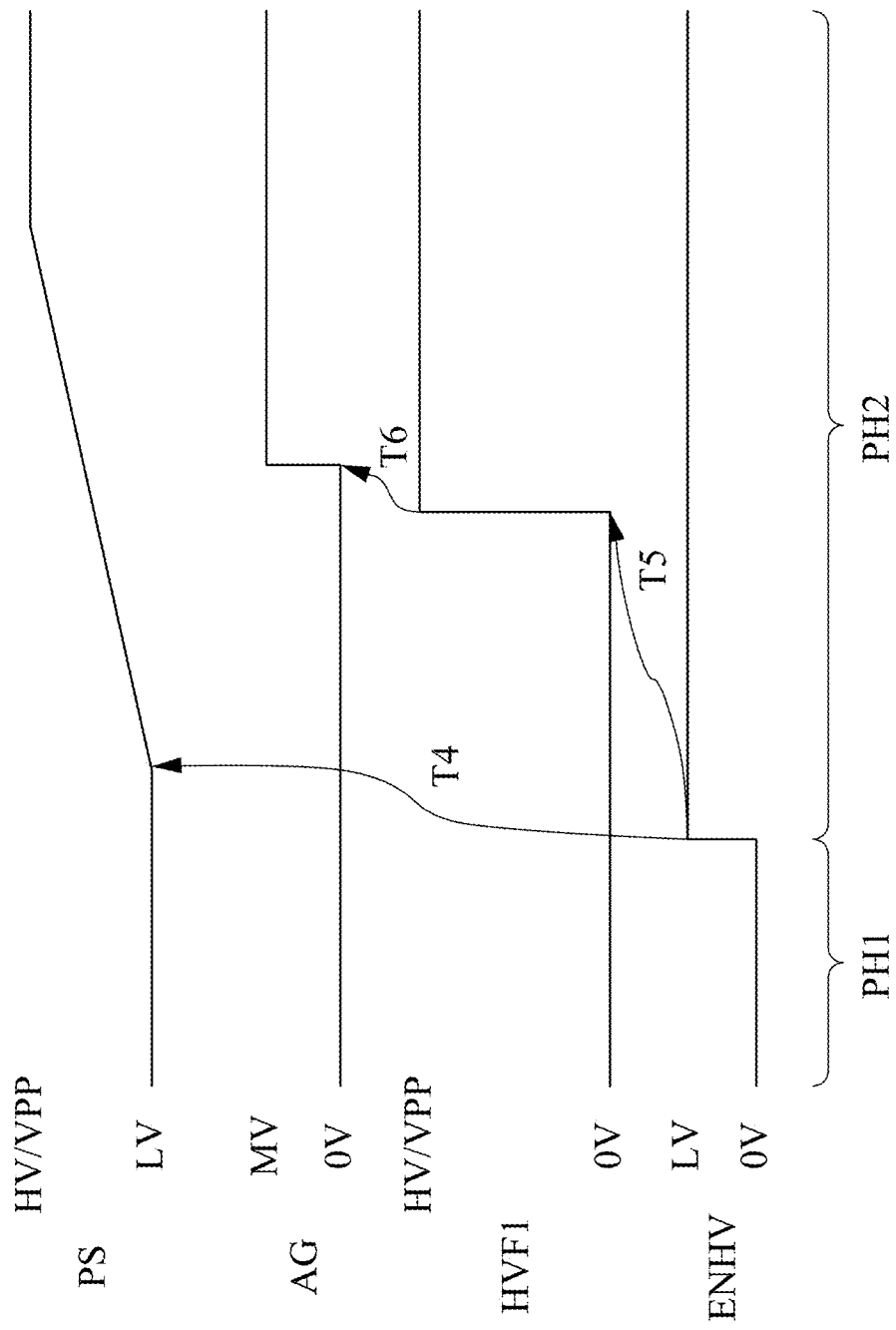
FIG. 6B is a diagram of driver circuit parameters, in accordance with some embodiments.

FIG. 6A is a diagram of driver circuit 110AC, and FIG. 6B is a diagram of corresponding driver circuit parameters, in accordance with some embodiments. In the non-limiting example depicted in FIG. 6A, driver circuit 110AC includes HV driver 400 discussed above with respect to FIG. 4, and HV power switch 600 usable as HV power switch HVPSU or HVPSD discussed above with respect to FIG. 1B. For the purpose of illustration, FIG. 6A includes a simplified version of HV driver 400.

HV power switch 600 includes level shifter/power switch S1, transistors N10 and N11, and inverter IN1 configured as discussed above with respect to HV power switch 500 and FIG. 5A. Instead of transistors P5 and N9 and current source CS1, HV power switch 600 includes a delay and HV level shifter circuit D1, also referred to as a delay circuit D1 in some embodiments.

Delay circuit D1 is an electronic circuit configured to receive HV enable signal ENHV, and responsive to a rising edge of HV enable signal ENHV, output rising edges in each of a control signal (not labeled) to inverter IN1 and signal HVF1 (as level shifted) after a predetermined delay period.

As illustrated in FIG. 6B, signals ENHV, HVF1, AG, and PS have waveforms during phases PH1 and PH2 corresponding to those discussed above with respect to HV power switch 500 and FIGS. 5A and 5B. Instead of transitions T1-T3, FIG. 6B depicts transitions T4-T6.

At the beginning of phase PH1, HV enable signal having the ground voltage level causes delay circuit D1 to output signal HVF1 having the ground voltage level and control inverter IN1 to have the high logical state, thereby causing ground signal AG to have the ground voltage level as discussed above.

Transition T4 corresponds to transition T1 discussed above in which the rising edge of HV enable signal ENHV causes level shifter/power switch S1 to ramp output power signal PS from voltage level LV toward voltage level VPP of HV power signal HV at the end of phase PH1 and beginning of phase PH2. The rising edge of HV enable signal ENHV also causes delay circuit D1 to output signal HVF1 having voltage level VPP of HV power signal HV (and cause inverter IN1 to output signal HVF2 having the ground voltage level) after the predetermined delay period, depicted as transition T5.

Transition T6 corresponds to transition T3 discussed above, after which HV power switch 600 outputs ground signal AG having voltage level MV.

By the configurations discussed above, memory circuit 100 including HV driver 400 and a HV power switch HVPSU or HVPSD including one of HV power switches 500 or 600 is capable of outputting HV activation signal WLP having the properties discussed above with respect to memory circuit 100 such that memory circuit 100 including HV driver 400 and a HV power switch HVPSU or HVPSD including one of HV power switches 500 or 600 is capable of realizing the benefits discussed above.

Figure 7A:
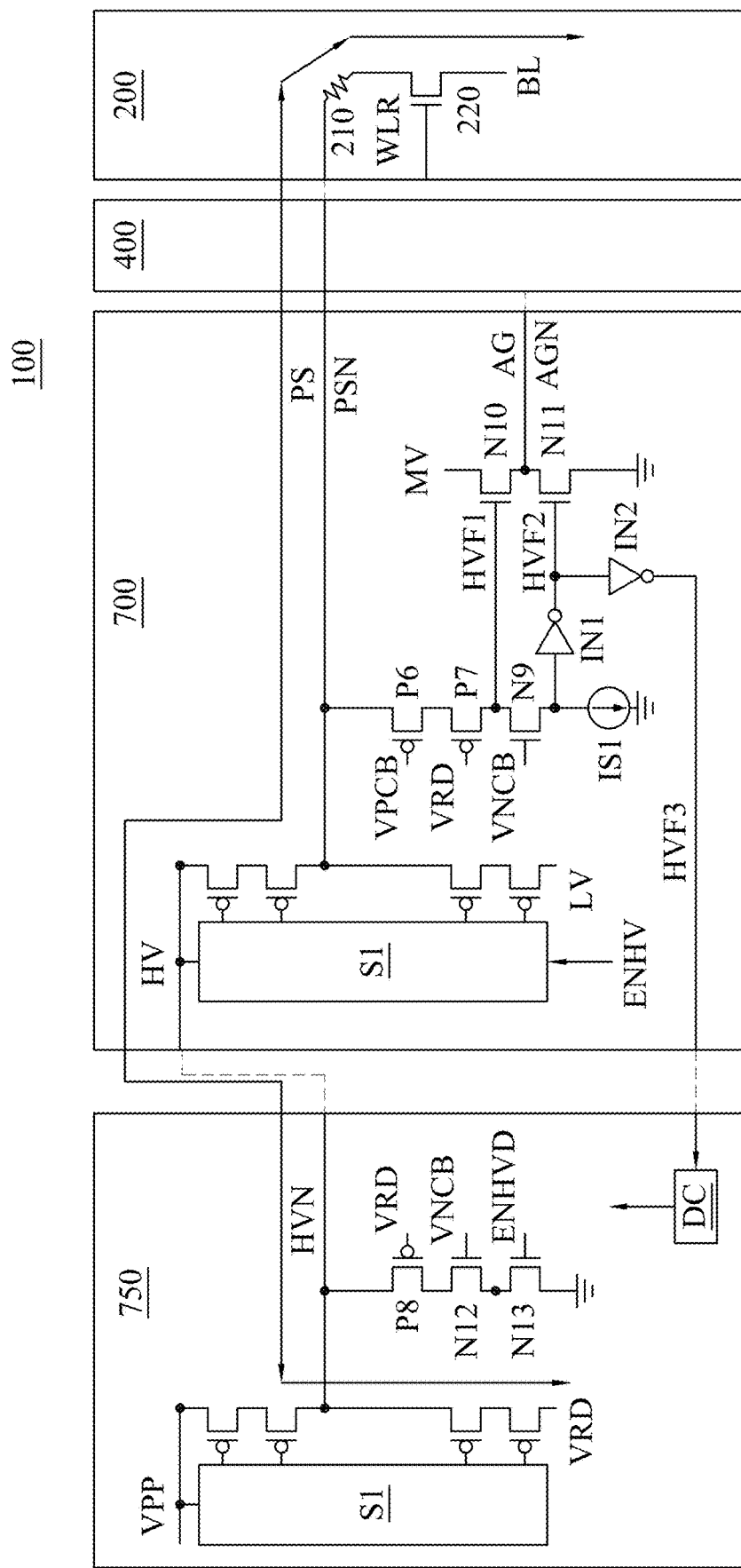
FIG. 7A is a diagram of a memory circuit, in accordance with some embodiments.
Figure 7B:
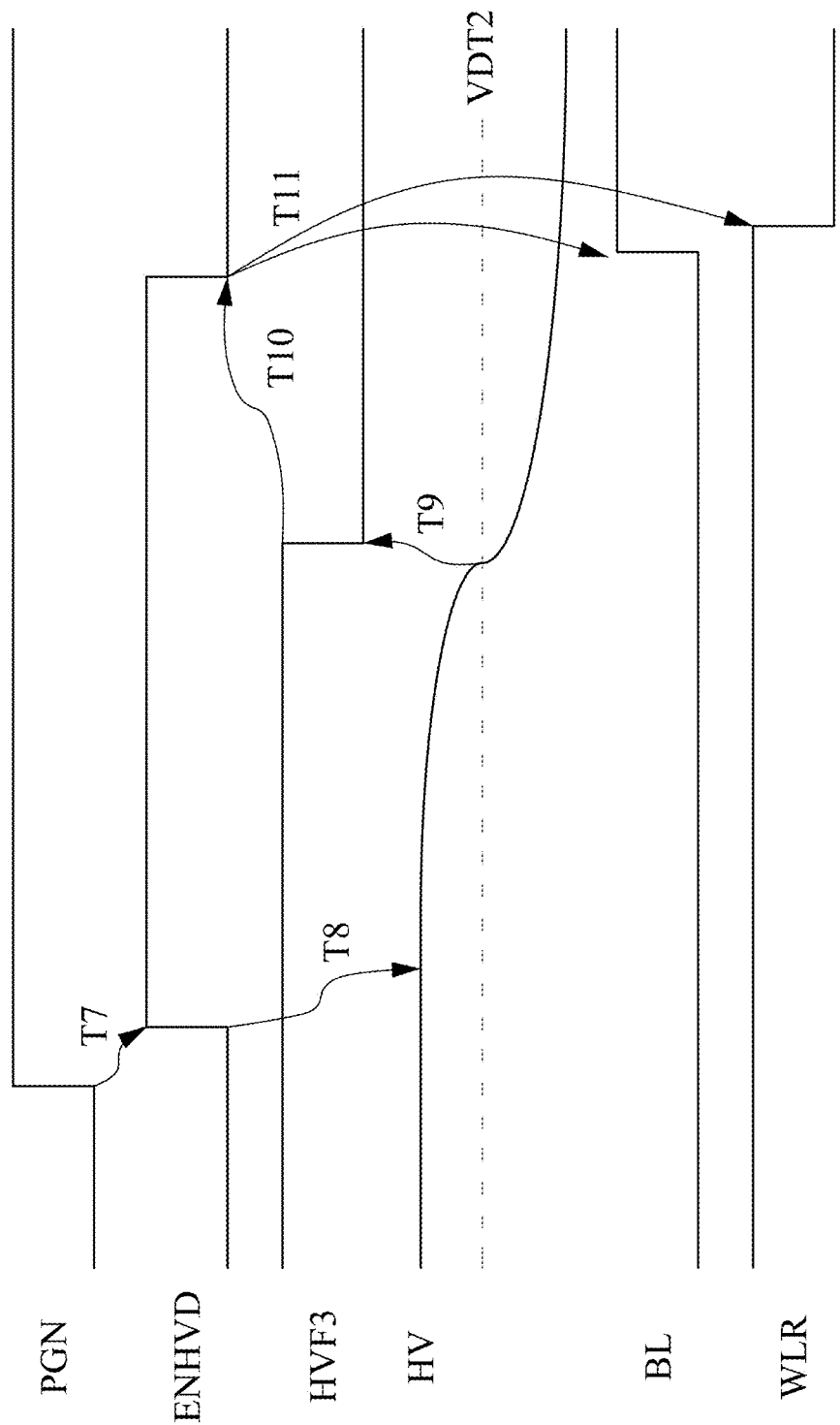
FIG. 7B is a diagram of memory circuit parameters, in accordance with some embodiments.
Figure 7C:
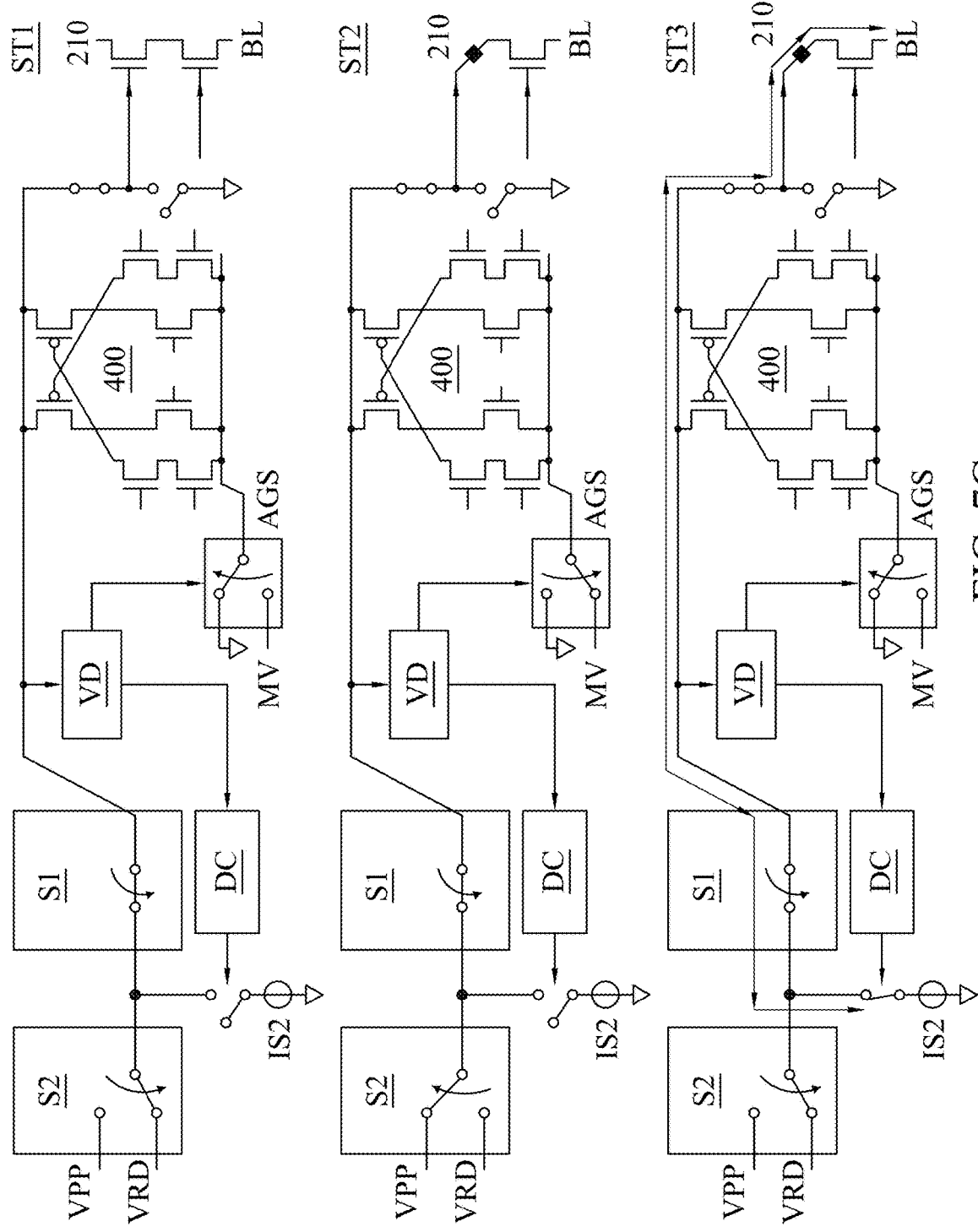
FIG. 7C is a diagram of a memory circuit, in accordance with some embodiments.

Each of FIGS. 7A and 7C is a diagram of an instance of memory circuit 100, and FIG. 7B is a diagram of corresponding memory circuit parameters, in accordance with some embodiments. In the non-limiting example depicted in FIG. 7A, memory circuit 100 includes HV driver 400 discussed above with respect to FIG. 4, HV power switch 700 usable as HV power switch HVPSU or HVPSD, and a global HV power switch 750 usable as global HV power switch HVSU or HVSD, each discussed above with respect to FIG. 1B. For the purpose of illustration, FIG. 7A includes a simplified version of HV driver 400.

For the purpose of illustration, in the embodiment depicted in FIGS. 7A-7C, memory circuit 100 includes OTP devices 200, represented by a single instance of OTP device 200 in which received activation signal WLR has the logical state corresponding to switching on transistor 220, thereby providing a current path to bit line BL. In some embodiments, memory circuit 100 includes NVM devices 112 other than OTP devices 200 and is otherwise configured to provide one or more current paths to one or more bit lines BL.

HV power switch 700 includes level shifter/power switch S1, transistors N9-N11, current source IS1, and inverter IN1 configured as discussed above with respect to HV power switch 500 and FIG. 5A. Instead of PMOS transistor P5, HV power switch 700 includes PMOS transistors P6 and P7 coupled between power signal node PSN and NMOS transistor N9, and HV power switch 700 also includes an inverter IN2 having an input terminal coupled to the output terminal of inverter IN1.

A gate of transistor P6 is configured to receive cascode bias voltage VPCB, and a gate of PMOS transistor P7 is configured to receive voltage level VRD, each discussed above, such that HV power switch 700 is configured to, in operation, output ground signal AG on ground signal node AGN responsive to detecting the voltage level of power signal PS on power signal node PSN in accordance with the discussion above with respect to HV power switch 500 and FIGS. 5A and 5B.

In the embodiment depicted in FIG. 7A, as power signal PS ramps from voltage level LV to voltage level VPP, HV power switch 700 is thereby configured to detect the voltage level of power signal PS relative to reference voltage VDT1, discussed above with respect to FIG. 5B, based on cascode bias voltage VPCB, voltage level VRD, and the threshold voltages of PMOS transistors P6 and P7. In some embodiments, HV power switch 700 is thereby configured to detect the voltage level of power signal PS relative to reference voltage VDT1 having a voltage level approximately equal to half of voltage level VPP.

By including inverter IN2, HV power switch 700 is further configured to generate signal HVF3 responsive to detecting the voltage level of power signal PS on power signal node PSN such that signal HVF3 is usable by global HV power switch 750 in a discharge operation as discussed below.

Global HV power switch 750 includes a level shifter/power switch S2 coupled to a node HVN, a discharge control circuit DC, and PMOS transistor P8 and NMOS transistors N12 and N13 coupled in series between node HVN and the ground reference node.

Level shifter/power switch S2 is configured to output HV power signal HV on node HVN having one of received voltage levels VPP or VRD. Discharge control circuit DC is configured to receive signal HVF3 from HV power switch 700 and output a discharge enable signal ENHVD. A gate of transistor P8 is configured to receive voltage level VRD, a gate of NMOS transistor N12 is configured to receive cascode bias voltage VNCB, and a gate of NMOS transistor N13 is configured to receive enable signal ENHVD.

Memory circuit 100 including global HV power switch 750 and HV power switch 700 is thereby configured to control a program operation including a discharge operation as discussed below with reference to FIGS. 7B and 7C.

FIG. 7B includes a control signal PGM, e.g., received from functional circuit 100F, discharge enable signal ENHVD, signal HVF3, HV power signal HV, a BL signal BL, and activation signal WLR plotted over time (not labeled). HV power signal HV is plotted relative to a reference voltage VDT2 corresponding to voltage level VRD plus a threshold voltage of PMOS transistor P7.

HV power switch 700 and voltage level VRD are configured such that reference voltage VDT2 has a voltage level less than that of reference voltage VDT1 discussed above. In some embodiments, HV power switch 700 and voltage level VRD are configured such that reference voltage VDT2 has a voltage level between 1.5 V and 2.0 V. In some embodiments, HV power switch 700 and voltage level VRD are configured such that reference voltage VDT2 has a voltage level approximately equal to 1.8 V.

At the beginning of the period depicted in FIG. 7B, control signal PGM has the low logical state corresponding to the program operation, followed by a rising edge corresponding to the beginning of the discharge operation. The rising edge of control signal PGM causes discharge control circuit DC to output discharge enable signal ENHVD having the high logical state, depicted as transition T7.

The rising edge of discharge enable signal ENHVD causes level shifter/power switch S2 to ramp HV power signal HV from voltage level VPP toward voltage level VRD, depicted as transition T8.

HV power signal HV decreasing below reference voltage VDT2 causes PMOS transistor P6 to switch off such that signal HVF2 has the high logical state and signal HVF3 has the ground voltage level, depicted as transition T9.

The falling edge of signal HVF3 causes discharge control circuit DC to output discharge enable signal ENHVD having the low logical state, depicted as transition T10, and the falling edge of discharge enable signal ENHVD causes BL signal BL to have the high logical state and activation signal WLR to have the ground voltage level, depicted collectively as transition T11.

As depicted by arrows in FIG. 7A, during the period from transition T7 to transition T10, memory circuit 100 provides dual current discharge paths. A first discharge path to the ground reference node is provided through transistors P8, N12, and N13, and a second discharge path is provided through bit line BL and transistors 210 and 220 of OTP device 200, programmed to a low resistance state during the program operation.

At transition T10, the falling edge of discharge enable signal ENHVD causes transistor N13 to switch off, thereby opening the first discharge path, and the subsequent falling edge of activation signal WLR causes transistor 220 to switch off, thereby opening the second discharge path.

Because transition T10 is based on detecting HV power signal HV decreasing below reference voltage VDT2 at transition T9, memory circuit 100 is configured as depicted in FIG. 7A such that the discharge operations are ended after HV power signal HV has a voltage level below that of reference voltage VDT2. Because subsets of NVM devices 112, e.g., OTP device 200 depicted in FIG. 7A, are biased collectively during program operations, ensuring that HV power signal HV has a voltage level below that of reference voltage VDT2 avoids leaving potentially damaging residual voltages on the subsets of NVM devices.

The program operation is further illustrated in FIG. 7C. FIG. 7C depicts three programming states: an initiation state ST1, a program state ST2, and a termination state ST3. Each state includes a simplified depiction of the embodiment depicted n FIG. 7A.

In each state ST1, ST2, and ST3, global HV power switch 750 is depicted as level shifter/power switch S2, discharge control circuit DC, and transistors P8, N12, and N13 represented by a current source IS2. HV power switch 700 is depicted as level shifter/power switch S1, transistors P6, P6, N9 and inverters IN1 and IN2 represented by a voltage detector VD, and transistors N10 and N11 represented by a ground switch AGS. HV driver 400 is depicted including output node WLPN (not labeled) coupled to power signal node PSN (not labeled) corresponding to a subset of NVM devices 112 being selected in the program operation. The subset of NVM devices is represented by a non-limiting example of OTP device 200 including program transistor 210 and read transistor 220 (not labeled) switch on, thereby providing a current path to bit line BL having the ground voltage level.

In state ST1, HV power signal HV having voltage level VRD propagates from level shifter/power switch S2 through level shifter/power switch S1 and HV driver 400 to the gate of transistor 210. Discharge control circuit DC outputs discharge enable signal ENHVD causing current source IS2 to be switched off. Based on voltage detector VD detecting HV power signal HV having voltage level VRD below reference voltage VDT1, ground switch AGS is coupled to the ground reference node such that ground signal AG has the ground voltage level.

In state ST2, HV power signal HV having programming voltage level VPP propagates from level shifter/power switch S2 through level shifter/power switch S1 and HV driver 400 to the gate of transistor 210, thereby programming the selected NVM device 112 to the low resistance state, e.g., by forming a conduction channel in the gate of transistor 210. Based on voltage detector VD detecting HV power signal HV having voltage level VPP greater than reference voltage VDT1, discharge control circuit DC outputs discharge enable signal ENHVD causing current source IS2 to remain switched off, and ground switch AGS is coupled to voltage node/level MV such that ground signal AG has voltage level MV.

In state ST3, HV power signal HV decreasing to voltage level VRD propagates from level shifter/power switch S2 through level shifter/power switch S1 and HV driver 400 to the gate of transistor 210. Based on voltage detector VD detecting HV power signal HV having the voltage level below reference voltage VDT2, discharge control circuit DC outputs discharge enable signal ENHVD causing current source IS2 to be switched on, and ground switch AGS is coupled to the ground voltage reference node such that ground signal AG has the ground voltage level. The resultant dual current discharge paths discussed above with respect to FIG. 7B are represented by arrows in FIG. 7C.

By the configuration discussed above with respect to FIGS. 7A-7C, memory circuit 100 including HV driver 400, a HV power switch HVPSU or HVPSD including HV power switch 700, and a global HV power switch HVSU or HVSD including global HV power switch 750 is capable of outputting HV activation signal WLP having the properties discussed above with respect to memory circuit 100 such that memory circuit 100 including HV driver 400, a HV power switch HVPSU or HVPSD including HV power switch 700, and a global HV power switch HVSU or HVSD including global HV power switch 750 is capable of realizing the benefits discussed above.

In state ST3, HV power signal HV decreasing to voltage level VRD propagates from level shifter/power switch S2 through level shifter/power switch S1 and HV driver 400 to the gate of transistor 210. Based on voltage detector VD detecting HV power signal HV having the voltage level below reference voltage VDT2, discharge control circuit DC outputs discharge enable signal ENHVD causing current source IS2 to be switched on, and ground switch AGS is coupled to the voltage reference node such that ground signal AG has the voltage level. The resultant dual current discharge paths discussed above with respect to FIG. 7B are represented by arrows in FIG. 7C.

By the configuration discussed above with respect to FIGS. 7A-7C, memory circuit 100 including HV driver 400, a HV power VPSU or HVPSD including HV power switch 700, and a global HV power switch HVSU or HVSD including global HV power switch 750 is capable of outputting HV activation signal WLP having the properties discussed above with respect to memory circuit 100 such that memory circuit 100 including HV driver 400, a HV power switch HVPSU or HVPSD including HV power switch 700, and a global HV power switch HVSU or HVSD including global HV power switch 750 is capable of realizing the benefits discussed above.

Memory circuit 100 including HV driver 400, a HV power switch HVPSU or HVPSD including HV power switch 700, and a global HV power switch HVSU or HVSD including global HV power switch 750 is further capable of using detected HV levels through a feedback arrangement whereby discharge times are controlled during NVM device program operations. Compared to approaches that do not include detecting HV levels to control discharge times, such embodiments are capable of reducing power requirements and avoiding residual voltage damage in subsequent operations.

FIG. 8 is a flowchart of a method 800 of performing a programming operation, in accordance with one or more embodiments. Method 800 is usable with a memory circuit, e.g., memory circuit 100 discussed above with respect to FIGS. 1A-7C.

The sequence in which the operations of method 800 are depicted in FIG. 8 is for illustration only; the operations of method 800 are capable of being executed in sequences that differ from that depicted in FIG. 8. In some embodiments, operations in addition to those depicted in FIG. 8 are performed before, between, during, and/or after the operations depicted in FIG. 8. In some embodiments, the operations of method 800 are a subset of operations of a method of operating a memory circuit.

At operation 810, in some embodiments, an address signal having a configuration corresponding to an NVM device in a first bank of NVM devices is received at a driver circuit adjacent to the first bank of NVM devices and to a second bank of NVM devices. In some embodiments, receiving the address signal at the driver circuit includes receiving address signals 100AD at a driver circuit 110AC adjacent to memory banks 110U and 110D as discussed above with respect to FIGS. 1A and 1B.

At operation 820, in response to the address signal having the configuration corresponding to the NVM device in the first bank of NVM devices, first and second HV power signals are generated by first and second global HV power switches. The first HV power signal has a first voltage magnitude and the second HV power signal has a second voltage magnitude less than the first voltage magnitude.

In some embodiments, generating the first and second HV power signals includes using global HV power switch HVSU to generate HV power signal HVU having voltage level VPP and global HV power switch HVSD to generate HV power signal HVD having voltage level VRD as discussed above with respect to FIGS. 1A-7C.

At operation 830, the first and second power signals are received at the driver circuit adjacent to the first and second banks of NVM devices. In some embodiments, receiving the first and second power signals includes receiving HV power signal HVU at HV power switch HVPSU and HV power signal HVD at HV power switch HVPSD as discussed above with respect to FIGS. 1A-7C.

At operation 840, in response to the address signal having the configuration, a first HV activation signal is output to the NVM device from the driver circuit, the first HV activation signal having the first voltage magnitude. In some embodiments, outputting the first HV activation signal to the NVM device includes using HV driver HVDR to output HV activation signal WLPU having voltage level VPP to a subset of NVM devices 112 as discussed above with respect to FIGS. 1A-7C. In some embodiments, using HV driver HVDR to output HV activation signal WLPU includes using HV driver 400 discussed above with respect to FIGS. 4-7C.

In some embodiments, outputting the first HV activation signal having the first voltage magnitude includes using a HV switch in the driver circuit to generate a ground signal having a fourth voltage magnitude between the first voltage magnitude and a ground voltage level. In some embodiments, using the HV switch in the driver circuit to generate the ground signal having the fourth voltage magnitude includes using one of HV power switches 500-700 discussed above with respect to FIGS. 5A-7C.

In some embodiments, the NVM device comprises an OTP device, and outputting the first HV activation signal from the driver circuit to the NVM device includes outputting the first HV activation signal and another activation signal to the OTP device. In some embodiments, outputting the first HV activation signal and another activation signal to the OTP device includes outputting HV activation signal WLP and activation signal WLR to OTP device 200 as discussed above with respect to FIG. 2.

At operation 850, in response to the address signal having the configuration, a second HV activation signal is output to the second bank of NVM devices from the driver circuit, the second HV activation signal having a third voltage magnitude equal to or less than the second voltage magnitude. In some embodiments, outputting the second HV activation signal to the second bank of NVM devices includes using HV driver HVDR to output HV activation signal WLPD having voltage level VRD or voltage level LV to a subset of NVM devices 112 as discussed above with respect to FIGS. 1A-7C. In some embodiments, using HV driver HVDR to output HV activation signal WLPD includes using HV driver 400 discussed above with respect to FIGS. 4-7C.

In some embodiments, each of outputting the first HV activation signal in operation 840 and outputting the second activation signal is in response to a same enable signal generated by the driver circuit, and outputting the second HV activation signal from the driver circuit to the second bank of NVM devices includes the second HV activation signal having the third voltage magnitude equal to the second voltage magnitude. In some embodiments, generating the same enable signal by the driver circuit includes using decode circuit 300A to generate enable signals ENU and END as discussed above with respect to FIG. 3A.

In some embodiments, outputting the first HV activation signal in operation 840 is in response to a first enable signal generated by the driver circuit, outputting the second activation signal is in response to a second enable signal generated by the driver circuit separately from the first enable signal, and outputting the second HV activation signal from the driver circuit to the second bank of NVM devices includes the second HV activation signal having the third voltage magnitude equal to a ground voltage level. In some embodiments, generating the first and second enables signal by the driver circuit includes using decode circuit 300B to generate enable signals ENU and END as discussed above with respect to FIG. 3B.

At operation 860, in some embodiments, the driver circuit is used to perform a discharge operation on the NVM device, the discharge operation including detecting a voltage level of the first HV power signal. In some embodiments, performing the discharge operation includes using global HV power switch 750, HV power switch 700, and HV driver 400 to detect a voltage level of HV power signal HV as discussed above with respect to FIGS. 7A-7C.

By executing the operations of method 800, a programming operation is performed on a memory circuit in which a dual path, hierarchical arrangement is used to distribute HV levels such that non-selected NVM devices in banks adjacent to device driver circuits receive a corresponding HV activation signal having either a LV or ground voltage level, thereby realizing the benefits discussed above with respect to memory circuit 100.

In some embodiments, a memory circuit includes a first bank of NVM devices, a first plurality of decoders, wherein each decoder of the first plurality of decoders is configured to generate an enable signal corresponding to a column of the first bank of NVM devices, a first plurality of HV drivers corresponding to the first plurality of decoders, and a first plurality of HV power switches, wherein a first HV power switch of the first plurality of HV power switches is coupled to each HV driver of the first plurality of HV drivers, wherein each HV driver of the first plurality of HV drivers is configured to output a HV activation signal to the corresponding column of the first bank of NVM devices responsive to a power signal of the first HV power switch of the first plurality of HV power switches and to the enable signal of the corresponding decoder of the first plurality of decoders. In some embodiments, the memory circuit includes a second bank of NVM devices, a second plurality of HV drivers corresponding to the first plurality of decoders, and a second plurality of HV power switches, wherein a first HV power switch of the second plurality of HV power switches is coupled to each HV driver of the second plurality of HV drivers, wherein each decoder of the first plurality of decoders is configured to generate the enable signal further corresponding to a column of the second bank of NVM devices, and each HV driver of the second plurality of HV drivers is configured to output a HV activation signal to the corresponding column of the second bank of NVM devices responsive to a power signal of the first HV power switch of the second plurality of HV power switches and to the enable signal of the corresponding decoder of the first plurality of decoders. In some embodiments, the memory circuit includes a second bank of NVM devices, a second plurality of decoders, wherein each decoder of the second plurality of decoders is configured to generate an enable signal corresponding to a column of the second bank of NVM devices, a second plurality of HV drivers corresponding to the second plurality of decoders, and a second plurality of HV power switches, wherein a first HV power switch of the second plurality of HV power switches is coupled to each HV driver of the second plurality of HV drivers, wherein each HV driver of the second plurality of HV drivers is configured to output a HV activation signal to the corresponding column of the second bank of NVM devices responsive to a power signal of the first HV power switch of the second plurality of HV power switches and to the enable signal of the corresponding decoder of the second plurality of decoders. In some embodiments, the first plurality of HV drivers is one plurality of HV drivers of a plurality of pluralities of HV drivers, and each HV power switch of the first plurality of HV power switches is coupled to each HV driver of a corresponding plurality of HV drivers of the plurality of pluralities of HV drivers. In some embodiments, the memory circuit includes a global HV power switch configured to generate a HV power signal, wherein each HV power switch of the first plurality of HV power switches is configured to generate the power signal and a ground signal based on the HV power signal. In some embodiments, each HV power switch of the first plurality of HV power switches includes a level detector configured to switch the ground signal from a ground voltage level to a middle voltage level responsive to a voltage level of the HV power signal. In some embodiments, each HV power switch of the first plurality of HV power switches includes a delay circuit configured to switch the ground signal from a ground voltage level to a middle voltage level responsive to a HV enable signal. In some embodiments, wherein each NVM device of the first bank of NVM devices includes an OTP bit, each OTP bit including a program transistor configured to receive the HV activation signal from a corresponding HV driver of the first plurality of HV drivers, and a read transistor configured to receive an activation signal based on the enable signal of a corresponding decoder of the first plurality of decoders.

In some embodiments, a memory circuit includes first and second OTP devices, each OTP device including a read transistor and a program transistor, and a driver circuit including a first HV power switch configured to generate a first power signal, a second HV power switch configured to generate a second power signal, a first HV driver configured to output a first HV activation signal to the program transistor of the first OTP device responsive to the first power signal, and a second HV driver configured to output a second HV activation signal to the program transistor of the second OTP device responsive to the second power signal, wherein the driver circuit is configured to output a first activation signal to the read transistor of the first OTP device and a second activation signal to the read transistor of the second OTP device, the first activation signal and the first HV activation signal are based on a first enable signal, and the second activation signal and the second HV activation signal are based on a second enable signal. In some embodiments, the driver circuit includes a decoder configured to generate the first and second enable signals as a same enable signal, and each of the first and second activation signals and the first and second HV activation signals is based on the same enable signal. In some embodiments, the driver circuit includes a first decoder configured to generate the first enable signal, and a second decoder configured to generate the second enable signal separate from the first enable signal. In some embodiments, the first HV driver is one first HV driver of a plurality of first HV drivers, the second HV driver is one second HV driver of a plurality of second HV drivers, each first HV driver of the plurality of first HV drivers is coupled to the first HV power switch, and each second HV driver of the plurality of second HV drivers is coupled to the second HV power switch. In some embodiments, the first HV power switch is one first HV power switch of a plurality of first HV power switches, the second HV power switch is one second HV power switch of a plurality of second HV power switches, each first HV power switch of the plurality of first HV power switches is coupled to a first global HV power switch, and each second HV power switch of the plurality of second HV power switches is coupled to a second global HV power switch. In some embodiments, the first HV power switch is configured to generate the first power signal and a first ground signal based on a first HV power signal, a first LV power signal, and a first HV enable signal, and the second HV power switch is configured to generate the second power signal and a second ground signal based on a second HV power signal, a second LV power signal, and a second HV enable signal.

In some embodiments, a method of performing a programming operation includes, in response to an address signal having a configuration corresponding to a NVM device in a first bank of NVM devices, generating a first HV power signal having a first voltage magnitude, and generating a second HV power signal having a second voltage magnitude less than the first voltage magnitude, receiving the first and second HV power signals and the address signal at a driver circuit adjacent to the first bank of NVM devices and to a second bank of NVM devices, and in response to the address signal having the configuration, outputting a first HV activation signal from the driver circuit to the NVM device, the first HV activation signal having the first voltage magnitude, and outputting a second HV activation signal from the driver circuit to the second bank of NVM devices, the second HV activation signal having a third voltage magnitude equal to or less than the second voltage magnitude. In some embodiments, each of outputting the first HV activation signal and outputting the second activation signal is in response to a same enable signal generated by the driver circuit, and outputting the second HV activation signal from the driver circuit to the second bank of NVM devices includes the second HV activation signal having the third voltage magnitude equal to the second voltage magnitude. In some embodiments, outputting the first HV activation signal is in response to a first enable signal generated by the driver circuit, outputting the second activation signal is in response to a second enable signal generated by the driver circuit separately from the first enable signal, and outputting the second HV activation signal from the driver circuit to the second bank of NVM devices includes the second HV activation signal having the third voltage magnitude equal to a ground voltage level. In some embodiments, outputting the first HV activation signal having the first voltage magnitude includes using a HV switch in the driver circuit to generate a ground signal having a fourth voltage magnitude between the first voltage magnitude and a ground voltage level. In some embodiments, the NVM device includes an OTP device, and outputting the first HV activation signal from the driver circuit to the NVM device includes outputting the first HV activation signal and another activation signal to the OTP device. In some embodiments, the method includes performing a discharge operation on the NVM device, the discharge operation including detecting a voltage level of the first HV power signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
a first bank of non-volatile memory (NVM) devices;
a first plurality of decoders, wherein each decoder of the first plurality of decoders is configured to generate an enable signal corresponding to a column of the first bank of NVM devices;
a first plurality of high-voltage (HV) drivers corresponding to the first plurality of decoders; and
a first plurality of HV power switches, wherein a first HV power switch of the first plurality of HV power switches is coupled to each HV driver of the first plurality of HV drivers,
wherein each HV driver of the first plurality of HV drivers is configured to output a HV activation signal to the corresponding column of the first bank of NVM devices responsive to a power signal of the first HV power switch of the first plurality of HV power switches and to the enable signal of the corresponding decoder of the first plurality of decoders.

2. The memory circuit of claim 1, further comprising:
a second bank of NVM devices;
a second plurality of HV drivers corresponding to the first plurality of decoders; and
a second plurality of HV power switches, wherein a first HV power switch of the second plurality of HV power switches is coupled to each HV driver of the second plurality of HV drivers,
wherein
each decoder of the first plurality of decoders is configured to generate the enable signal further corresponding to a column of the second bank of NVM devices, and
each HV driver of the second plurality of HV drivers is configured to output a HV activation signal to the corresponding column of the second bank of NVM devices responsive to a power signal of the first HV power switch of the second plurality of HV power switches and to the enable signal of the corresponding decoder of the first plurality of decoders.

3. The memory circuit of claim 1, further comprising:
a second bank of NVM devices;
a second plurality of decoders, wherein each decoder of the second plurality of decoders is configured to generate an enable signal corresponding to a column of the second bank of NVM devices;
a second plurality of HV drivers corresponding to the second plurality of decoders; and
a second plurality of HV power switches, wherein a first HV power switch of the second plurality of HV power switches is coupled to each HV driver of the second plurality of HV drivers,
wherein each HV driver of the second plurality of HV drivers is configured to output a HV activation signal to the corresponding column of the second bank of NVM devices responsive to a power signal of the first HV power switch of the second plurality of HV power switches and to the enable signal of the corresponding decoder of the second plurality of decoders.

4. The memory circuit of claim 1, wherein
the first plurality of HV drivers is one plurality of HV drivers of a plurality of pluralities of HV drivers, and
each HV power switch of the first plurality of HV power switches is coupled to each HV driver of a corresponding plurality of HV drivers of the plurality of pluralities of HV drivers.

5. The memory circuit of claim 1, further comprising:
a global HV power switch configured to generate a HV power signal,
wherein each HV power switch of the first plurality of HV power switches is configured to generate the power signal and a ground signal based on the HV power signal.

6. The memory circuit of claim 5, wherein
each HV power switch of the first plurality of HV power switches comprises a level detector configured to switch the ground signal from a ground voltage level to a middle voltage level responsive to a voltage level of the HV power signal.

7. The memory circuit of claim 5, wherein
each HV power switch of the first plurality of HV power switches comprises a delay circuit configured to switch the ground signal from a ground voltage level to a middle voltage level responsive to a HV enable signal.

8. The memory circuit of claim 1, wherein each NVM device of the first bank of NVM devices comprises a one-time programmable (OTP) bit, each OTP bit comprising:
a program transistor configured to receive the HV activation signal from a corresponding HV driver of the first plurality of HV drivers; and
a read transistor configured to receive an activation signal based on the enable signal of a corresponding decoder of the first plurality of decoders.

9. A memory circuit comprising:
first and second one-time programmable (OTP) devices, each OTP device comprising a read transistor and a program transistor; and
a driver circuit comprising:
a first HV power switch configured to generate a first power signal;
a second HV power switch configured to generate a second power signal;
a first high-voltage (HV) driver configured to output a first HV activation signal to the program transistor of the first OTP device responsive to the first power signal; and
a second HV driver configured to output a second HV activation signal to the program transistor of the second OTP device responsive to the second power signal,
wherein
the driver circuit is configured to output a first activation signal to the read transistor of the first OTP device and a second activation signal to the read transistor of the second OTP device,
the first activation signal and the first HV activation signal are based on a first enable signal, and
the second activation signal and the second HV activation signal are based on a second enable signal.

10. The memory circuit of claim 9, wherein
the driver circuit comprises a decoder configured to generate the first and second enable signals as a same enable signal, and each of the first and second activation signals and the first and second HV activation signals is based on the same enable signal.

11. The memory circuit of claim 9, wherein the driver circuit comprises:
a first decoder configured to generate the first enable signal; and
a second decoder configured to generate the second enable signal separate from the first enable signal.

12. The memory circuit of claim 9, wherein
the first HV driver is one first HV driver of a plurality of first HV drivers,
the second HV driver is one second HV driver of a plurality of second HV drivers,
each first HV driver of the plurality of first HV drivers is coupled to the first HV power switch, and
each second HV driver of the plurality of second HV drivers is coupled to the second HV power switch.

13. The memory circuit of claim 9, wherein
the first HV power switch is one first HV power switch of a plurality of first HV power switches,
the second HV power switch is one second HV power switch of a plurality of second HV power switches,
each first HV power switch of the plurality of first HV power switches is coupled to a first global HV power switch, and
each second HV power switch of the plurality of second HV power switches is coupled to a second global HV power switch.

14. The memory circuit of claim 9, wherein
the first HV power switch is configured to generate the first power signal and a first ground signal based on a first HV power signal, a first low-voltage (LV) power signal, and a first HV enable signal, and
the second HV power switch is configured to generate the second power signal and a second ground signal based on a second HV power signal, a second LV power signal, and a second HV enable signal.

15. A method of performing a programming operation, the method comprising:
in response to an address signal having a configuration corresponding to a non-volatile memory (NVM) device in a first bank of NVM devices:
generating a first high-voltage (HV) power signal having a first voltage magnitude; and
generating a second HV power signal having a second voltage magnitude less than the first voltage magnitude;
receiving the first and second HV power signals and the address signal at a driver circuit adjacent to the first bank of NVM devices and to a second bank of NVM devices; and in response to the address signal having the configuration:
outputting a first HV activation signal from the driver circuit to the NVM device, the first HV activation signal having the first voltage magnitude; and
outputting a second HV activation signal from the driver circuit to the second bank of NVM devices, the second HV activation signal having a third voltage magnitude equal to or less than the second voltage magnitude.

16. The method of claim 15, wherein
each of the outputting the first HV activation signal and the outputting the second HV activation signal is in response to a same enable signal generated by the driver circuit, and
the outputting the second HV activation signal from the driver circuit to the second bank of NVM devices comprises the second HV activation signal having the third voltage magnitude equal to the second voltage magnitude.

17. The method of claim 15, wherein
the outputting the first HV activation signal is in response to a first enable signal generated by the driver circuit,
the outputting the second HV activation signal is in response to a second enable signal generated by the driver circuit separately from the first enable signal, and
the outputting the second HV activation signal from the driver circuit to the second bank of NVM devices comprises the second HV activation signal having the third voltage magnitude equal to a ground voltage level.

18. The method of claim 15, wherein the outputting the first HV activation signal having the first voltage magnitude comprises using a HV switch in the driver circuit to generate a ground signal having a fourth voltage magnitude between the first voltage magnitude and a ground voltage level.

19. The method of claim 15, wherein
the NVM device comprises a one-time-programmable (OTP) device, and
the outputting the first HV activation signal from the driver circuit to the NVM device comprises outputting the first HV activation signal and another activation signal to the OTP device.

20. The method of claim 15, further comprising performing a discharge operation on the NVM device, the discharge operation comprising detecting a voltage level of the first HV power signal.

* * * * *